United States Patent
Lin

(10) Patent No.: US 8,675,317 B2
(45) Date of Patent: Mar. 18, 2014

(54) CURRENT-PERPENDICULAR-TO-PLANE (CPP) READ SENSOR WITH DUAL SEED AND CAP LAYERS

(75) Inventor: Tsann Lin, Saratoga, CA (US)

(73) Assignee: HGST Netherlands B.V., Amsterdam (NL)

( * ) Notice: Subject to any disclaimer, the term of this patent is extended or adjusted under 35 U.S.C. 154(b) by 437 days.

(21) Appl. No.: 12/976,932

(22) Filed: Dec. 22, 2010

(65) Prior Publication Data

US 2012/0164485 A1    Jun. 28, 2012

(51) Int. Cl.
*G11B 5/127*    (2006.01)
*G11B 5/39*    (2006.01)

(52) U.S. Cl.
USPC .................. 360/324.11; 360/324.12

(58) Field of Classification Search
USPC .......................... 360/324.1–324.12
See application file for complete search history.

(56) References Cited

U.S. PATENT DOCUMENTS

| | | | | |
|---|---|---|---|---|
| 6,090,480 | A * | 7/2000 | Hayashi | ............ 428/811.2 |
| 6,650,513 | B2 | 11/2003 | Fullerton et al. | |
| 6,735,058 | B2 | 5/2004 | Lin et al. | |
| 6,756,237 | B2 | 6/2004 | Xiao et al. | |
| 6,867,951 | B1 * | 3/2005 | Kula | ............ 360/324.1 |
| 6,903,908 | B2 | 6/2005 | Hayashi et al. | |
| 7,663,197 | B2 | 2/2010 | Nagase et al. | |
| 7,663,845 | B2 | 2/2010 | Hirata et al. | |
| 7,961,441 | B2 * | 6/2011 | Kawamori et al. | ...... 360/324.11 |
| 2007/0188944 | A1 | 8/2007 | Hoshino et al. | |
| 2008/0285180 | A1 | 11/2008 | Tanaka et al. | |
| 2009/0161268 | A1 * | 6/2009 | Lin | ............ 360/324.11 |
| 2009/0251829 | A1 * | 10/2009 | Zhang et al. | ............ 360/319 |
| 2009/0257154 | A1 | 10/2009 | Carey et al. | |
| 2010/0128400 | A1 * | 5/2010 | Lin | ............ 360/319 |
| 2010/0149689 | A1 * | 6/2010 | Tsuchiya et al. | ............ 360/234.3 |

FOREIGN PATENT DOCUMENTS

JP    2009238259 A    10/2009

* cited by examiner

*Primary Examiner* — Brian Miller
*Assistant Examiner* — Carlos E Garcia
(74) *Attorney, Agent, or Firm* — Zilka-Kotab, PC

(57) ABSTRACT

A current-perpendicular-to-plane (CPP) tunneling magnetoresistance (TMR) or giant magnetoresistance (GMR) read sensor with dual seed and cap layers for high-resolution magnetic recording is provided by the invention. The dual seed layers comprise a lower seed layer preferably formed of a nonmagnetic Pt film and an upper seed layer preferably formed of a nonmagnetic Ru film. The lower seed layer separates the upper seed layer from a buffer layer preferably formed of a ferromagnetic Co—Hf film, in order to minimize moment losses at its lower interface and thus define a sharp lower bound of a read gap. In addition, the lower seed layer facilitates the CPP read sensor to exhibit high pinning properties, while the upper seed layer facilitates the CPP read sensor to exhibit robust thermal properties.

13 Claims, 26 Drawing Sheets

CURRENT-PERPENDICULAR-TO-PLANE (CPP) READ SENSOR WITH DUAL SEED AND CAP LAYERS

FIELD OF THE INVENTION

The invention relates to non-volatile magnetic storage devices and more particularly to a magnetic disk drive including a current-perpendicular-to-plane (CPP) tunneling magnetoresistance (TMR) or giant magnetoresistance (GMR) read sensor with dual seed and cap layers for high-resolution magnetic recording.

BACKGROUND OF THE INVENTION

One of many extensively used non-volatile magnetic storage devices is a magnetic disk drive that includes a rotatable magnetic disk and an assembly of write and read heads. The assembly of write and read heads is supported by a slider that is mounted on a suspension arm. The suspension arm is supported by an actuator that can swing the suspension arm to place the slider with its air bearing surface (ABS) over the surface of the magnetic disk.

When the magnetic disk rotates, an air flow generated by the rotation of the magnetic disk causes the slider to fly on a cushion of air at a very low elevation (fly height) over the magnetic disk. When the slider rides on the air, the actuator moves the suspension arm to position the assembly of write and read heads over selected data tracks on the magnetic disk. The write and read heads write and read data in the selected data tracks, respectively. Processing circuitry connected to the write and read heads then operates according to a computer program to implement writing and reading functions, respectively.

The write head includes a magnetic write pole and a magnetic return pole that are magnetically connected with each other at a region away from the ABS, and an electrically conductive write coil surrounding the write head. In a writing process, the electrically conductive write coil induces magnetic fluxes in the write head. The magnetic fluxes form a magnetic write field emitting from the magnetic write pole to the magnetic disk in a direction perpendicular to the surface of the magnetic disk. The magnetic write field writes data in the selected data tracks, and then returns to the magnetic return pole so that it will not erase previously written data in adjacent data tracks.

The read head includes a read sensor that is electrically connected with lower and upper ferromagnetic shields, but is electrically separated by insulation layers from longitudinal bias layers in two side regions. In a reading process, the read head passes over data in a selected data track, and magnetic fields emitting from the data modulate the resistance of the read sensor. Changes in the resistance of the read sensor are detected by a sense current passing through the read sensor, and are then converted into voltage changes that generate read signals. The resulting read signals are used to decode data in the selected data track.

A current-perpendicular-to-plane (CPP) tunneling magnetoresistance (TMR) or giant magnetoresistance (GMR) read sensor is typically used in the read head. The CPP TMR read sensor includes a nonmagnetic insulating barrier layer sandwiched between a ferromagnetic reference layer and a ferromagnetic sense layer, and the CPP GMR read sensor includes a nonmagnetic conducting spacer layer sandwiched between the ferromagnetic reference and sense layers. The thickness of the barrier or spacer layer is chosen to be less than the mean free path of conduction electrons passing through the CPP TMR or GMR read sensor. The magnetization of the reference layer is pinned in a direction perpendicular to the ABS, while the magnetization of the sense layer is oriented in a direction parallel to the ABS. When passing the sense current through the CPP TMR or GMR read sensor, the conduction electrons are scattered at lower and upper interfaces of the barrier or spacer layer. When receiving magnetic fields emitting from data in the selected data track, the magnetization of the reference layer remains pinned while that of the sense layer rotates. Scattering decreases as the magnetization of the sense layer rotates towards that of the reference layer, but increases as the magnetization of the sense layer rotates away from that of the reference layer. These scattering variations lead to changes in the resistance of the CPP TMR or GMR read sensor in proportion to the magnitudes of the magnetic fields and $\cos\theta$, where $\theta$ is an angle between the magnetizations of the reference and sense layers. The changes in the resistance of the CPP TMR or GMR read sensor are then detected by the sense current and converted into voltage changes that are processed as read signals.

The CPP TMR read sensor has been progressively miniaturized for magnetic recording at higher linear and track densities. Its thickness, which defines a read gap, is reduced by utilizing thinner reference, barrier, sense or other layers, in order to increase linear densities. Its width, which defines a track width, is reduced by patterning with an advanced photolithographic tool, in order to increase track densities. Further decreases in the thickness and width of the CPP TMR read sensor are desired in order to further increase the linear and track densities, respectively.

SUMMARY OF THE INVENTION

The invention provides a current-perpendicular-to-plane (CPP) tunneling magnetoresistance (TMR) or giant magnetoresistance (GMR) read sensor with dual seed and cap layers for high-resolution magnetic recording.

The dual seed layers comprise a lower seed layer preferably formed of a nonmagnetic Pt film and an upper seed layer preferably formed of a nonmagnetic Ru film. The lower seed layer separates the upper seed layer from a buffer layer preferably formed of a ferromagnetic Co—Hf film, in order to minimize moment losses at its lower interface and thus define a sharp lower bound of a read gap. In addition, the lower seed layer facilitates the CPP read sensor to exhibit high pinning properties, while the upper seed layer facilitates the CPP read sensor to exhibit robust thermal properties.

The dual cap layers comprise a lower cap layer preferably formed of a nonmagnetic Pt film and an upper cap layer preferably formed of a nonmagnetic Ru film. The lower cap layer separates the upper cap layer from an upper sense layer preferably formed of a ferromagnetic Co—Hf film, in order to minimize moment losses at its lower interface and thus reduce the thickness of the upper sense layer needed for a designed sense-layer saturation moment. In addition, the use of the dual cap layers enhance ferromagnetic decoupling between the upper sense layer and an upper shield.

Since the uses of the dual seed and cap layers lead to minimal moment losses, the read gap, defined by a distance between the lower interface of the lower seed layer and the upper interface of the upper cap layer, can be narrow enough to perform high-resolution magnetic recording.

These and other features and advantages of the invention will be apparent upon reading of the following detailed description of preferred and alternative embodiments of the

BRIEF DESCRIPTION OF THE DRAWINGS

For a fuller understanding of the nature and advantages of the invention, as well as the preferred mode of use, reference should be made to the following detailed description read in conjunction with the accompanying drawings which are not to scale.

Table 1 is a table summarizing $H_C$, $H_{UA}$, $J_K$ and $T_S$ is determined from the easy-axis magnetic and resistance responses of the Ir—Mn/Co—Fe films with various buffer and seed layers before and after baking at in accordance with the prior art.

Table 2 is a table summarizes $H_C$, $H_F$, $H_{SF}$, $H'_{SF}$, $R_J A_J$ and $\Delta R_T/R_J$ determined from easy-axis magnetic and resistance responses of CPP TMR read sensors with various buffer and seed layers after annealing for 5 hours at 280° C. in accordance with the prior art as wells preferred and alternative embodiments of the invention.

DETAILED DESCRIPTION OF THE EMBODIMENTS

The following description is of the best embodiments presently contemplated for carrying out the invention. This description is made for the purpose of illustrating the general principles of the invention and is not meant to limit the inventive concepts claimed herein.

Figure 1:
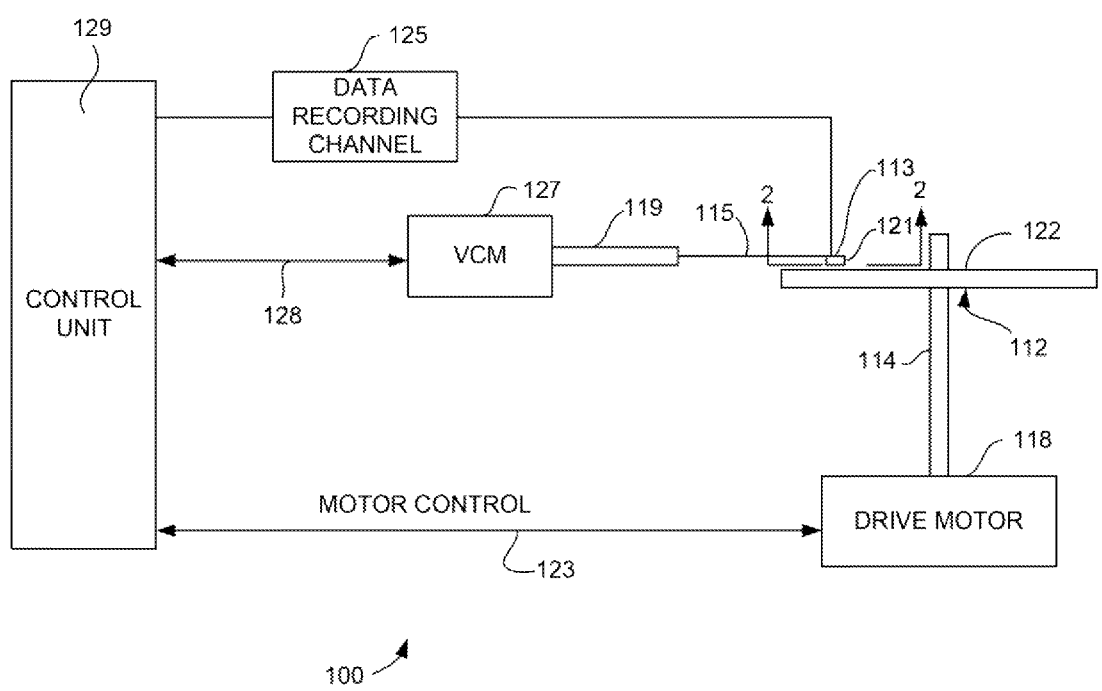
FIG. 1 is a schematic illustration of a magnetic disk drive in which the invention is embodied.

Referring now to FIG. 1, there is shown a magnetic disk drive 100 embodying the invention. As shown in FIG. 1, at least one rotatable magnetic disk 112 is supported on a spindle 114 and rotated by a disk drive motor 118. Magnetic recording on each magnetic disk 112 is performed at annular patterns of data tracks (not shown) on the magnetic disk 112.

At least one slider 113 is positioned near the magnetic disk 112, each slider 113 supporting one assembly of write and read heads 121. As the magnetic disk 112 rotates, the slider 113 moves radially in and out over the disk surface 122 so that the assembly of write and read heads 121 may access different data tracks (not shown) on the magnetic disk 112. Each slider 113 is mounted on a suspension arm 115 that is supported by an actuator 119. The suspension arm 115 provides a slight spring force which biases the slider 113 against the disk surface 122. Each actuator 119 is attached to an actuator means 127 that may be a voice coil motor (VCM). The VCM comprises a coil movable within a fixed magnetic field, the direction and speed of the coil movements being controlled by control signals supplied by a control unit 129.

During the operation of the magnetic disk drive 100, the rotation of the magnetic disk 112 generates an air bearing between the slider 113 and the disk surface 122, which exerts an upward force or lift on the slider 113. The air bearing thus counter-balances the slight spring force of the suspension arm 115 and supports the slider 113 off and slightly above the disk surface 122 by a small, substantially constant spacing during the operation of the magnetic disk drive 100.

The various components of the magnetic disk drive 100 are controlled in operation by the control signals generated by the control unit 129, such as access control signals and internal clock signals. Typically, the control unit 129 comprises logic control circuits, storage means and a microprocessor. The control unit 129 generates the control signals to control various system operations such as drive motor control signals on line 123, and head position and seek control signals on line 128. The control signals on line 128 provide the desired current profiles to optimally move and position the slider 113 to the desired data track (not shown) on the magnetic disk 112. Write and read signals are communicated to and from, respectively, the assembly of write and read heads 121 by way of a data recording channel 125.

Figure 2:
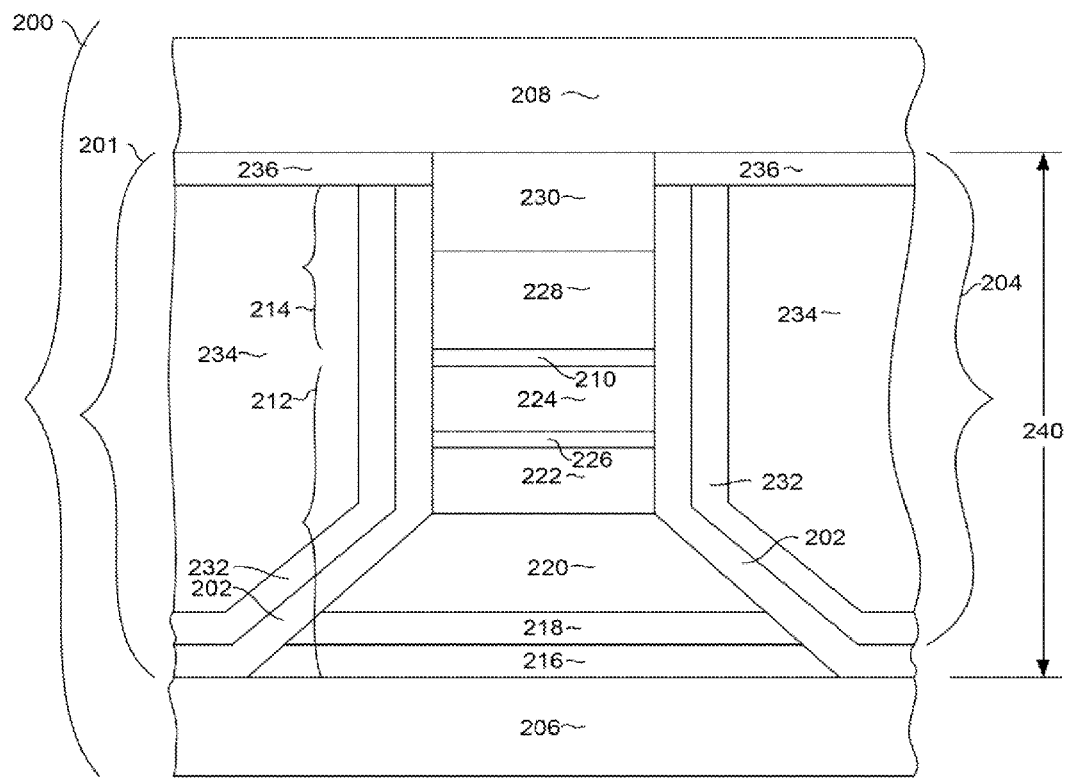
FIG. 2 is an ABS schematic view of a read head in accordance with the prior art.

In a read head 200 in accordance with the prior art, as shown in FIG. 2, a current-perpendicular-to-plane (CPP) tunneling magnetoresistance (TMR) or giant magnetoresistance (GMR) read sensor 201 is electrically connected with lower and upper ferromagnetic shields 206, 208 to allow a sense current to flow in a direction perpendicular to interfaces of the CPP TMR or GMR read sensor 201, but is electrically insulated by insulation layers 202 from longitudinal bias stacks 204 in two side regions to prevent the sense current from shunting through the two side regions.

The CPP TMR read sensor 201 includes an electrically insulating barrier layer 210 sandwiched between lower and upper sensor stacks 212, 214. The barrier layer 210 is formed of a nonmagnetic oxygen-doped Mg (Mg—O), Mg oxide (MgO), or Me—O/MgO/Mg—O ($MgO_X$) films having a thickness ranging from 0.4 to 1 nm. When the sense current quantum-jumps across the Mg—O, MgO or $MgO_X$ barrier layer 210, changes in the resistance of the CPP TMR read sensor 201 are detected through a TMR effect.

The CPP GMR read sensor 201 includes an electrically conducting spacer layer 210 sandwiched between lower and upper sensor stacks 212, 214. The spacer layer 210 is formed of a nonmagnetic Cu or oxygen-doped Cu (Cu—O) film having a thickness ranging from 1.6 to 4 nm. When the sense current flows across the Cu or Cu—O spacer layer 210, changes in the resistance of the CPP GMR read sensor 201 are detected through a GMR effect.

The lower sensor stack 212 comprises a buffer layer 216 formed of a 2 nm thick nonmagnetic Ta film, a seed layer 218 formed of a 2 nm thick nonmagnetic Ru film, a pinning layer 220 formed of a 6 nm thick antifrromagnetic 23.2Ir-76.8Mn (composition in atomic percent) film, a keeper layer structure 222, an antiparallel-coupling layer 226 formed of a 0.4 nm thick nonmagnetic Ru film, and a reference layer structure 224. The keeper layer structure 222 comprises a first keeper layer formed of a 1.6 nm thick 72.5Co-27.5Fe film and a second keeper layer formed of a 0.6 nm thick Co film. The thickness of the keeper layer structure 222 is selected in order to attain a saturation moment of 0.32 $memu/cm^2$ (corresponding to that of a 4.6 nm thick ferromagnetic 88Ni-12Fe film sandwiched between two Cu films). The reference layer structure 224 comprises a first reference layer formed of a 0.6 nm thick Co film, a second reference layer formed of a 0.6 nm thick 75.5Co-24.5Hf film, a third reference layer formed of a 1.2 nm thick 65.5Co-19.9Fe-14.6B film, and a fourth reference layer formed of a 0.3 nm thick 46.8Co-53.2 Fe film. The thickness of the reference layer structure 224 is selected in order to attain a saturation moment of 0.30 $memu/cm^2$ (corresponding to that of a 4.3 nm thick ferromagnetic 88Ni-12Fe film sandwiched into two Cu films).

The upper sensor stack 214 comprises a sense layer structure 228 and a cap layer structure 230. The sense layer structure 228 comprises a first sense layer formed of a 0.4 nm thick ferromagnetic 87.5Co-12.5Fe film, a second sense layer formed of a 1.6 nm thick ferromagnetic 79.3Co-4.0Fe-16.7B film, and a third sense layer formed of a 2.8 nm thick ferromagnetic 87.1Co-12.9Hf film. The thickness of the sense layer structure 228 is selected in order to attain a saturation moment of 0.42 $memu/cm^2$ (corresponding to that of a 6 nm thick ferromagnetic 88Ni-12Fe film sandwiched between two Cu films). The cap layer structure 230 comprises a first cap layer formed of a 2 nm thick nonmagnetic Ru film, a second cap layer formed of a 2 nm thick nonmagnetic Ta film, and a third cap layer formed of a 4 nm thick nonmagnetic Ru film.

A typical insulation layer 202 in each side region is formed of a 3 nm thick nonmagnetic, amorphous $Al_2O_3$ film. A typical longitudinal bias stack 204 in each side region comprises a seed layer 232 formed of a 4 nm thick nonmagnetic Cr film, a longitudinal bias layer 234 formed of a 24 nm thick hard-magnetic 82Co-18Pt film, and a cap layer 236 formed of a 10 nm thick nonmagnetic Cr film. The thickness of the Co—Pt longitudinal layer 234 is selected in order to attain a remnant moment of 2.1 $memu/cm^2$ (corresponding to that of a 30 nm thick ferromagnetic 88Ni-12Fe film sandwiched between two Cu films).

In the fabrication process of the read head 200, the CPP TMR or GMR read sensor 201 is deposited on a wafer with a lower shield 206 formed of a 1 μm thick ferromagnetic 80Ni-20Fe film in a sputtering system, and is annealed in a magnetic field of 50,000 Oe for 5 hours at 280° C. in a high-vacuum oven. The CPP TMR or GMR read sensor 201 is patterned in a photolithographic process to produce sensor front and rear edges, and then patterned again in another photographic process to produce sensor tails at the two side regions. The $Al_2O_3$ insulation layer 202 and the longitudinal bias stack 204 are then deposited into the two side regions. The photoresist is then removed and a chemical-mechanical-polishing process is conducted. The CPP TMR or GMR read sensor 201, the $Al_2O_3$ insulation layer 202, and the longitudinal bias stack 204 are then covered by the upper shield 208 also formed of a 1 μm thick ferromagnetic 80Ni-20Fe film, and by a gap formed of a 100 nm thick ferromagnetic $Al_2O_3$ film. A read gap 240 is defined by the thickness of the CPP TMR or GMR read sensor 201, or a distance between the lower shield 206 and the upper shield 208. After completing the read head fabrication process, the write head fabrication process starts.

The keeper layer structure 222, the antiparallel-coupling layer 226 and the reference layer structure 224 form a flux closure where four magnetic interactions occur. First, antiferromagnetic/ferromagnetic coupling occurs between the pinning layer 220 and the keeper layer structure 222, increasing the easy-axis coercivity ($H_C$) of the keeper layer structure 222 and inducing a unidirectional anisotropy field ($H_{UA}$). Second, ferromagnetic/ferromagnetic coupling occurs across the antiparallel-coupling layer 226 and between the keeper layer structure 222 and the reference layer structure 224, inducing a bidirectional anisotropy field ($H_{BA}$). Third, ferromagnetic/ferromagnetic coupling also occurs across the barrier layer 210 and between the reference structure 224 and the sense layer structure 228, increasing the easy-axis coercivity ($H_{CE}$) of the sense layer structure 228 and inducing a ferromagnetic-coupling field ($H_F$). Fourth, magnetostatic interaction occurs in the sense layer structure 228 due to stray fields that stem from the net magnetization of the keeper layer structure 222 and the reference layer structure 224, inducing a demagnetizing field ($H_D$). To ensure proper sensor operation, $H_{UA}$ and $H_{BA}$ must be high enough to rigidly pin the magnetizations of the keeper layer structure 222 and the reference layer structure 224 in opposite transverse directions perpendicular to the ABS, while $H_F$ and $H_D$ must be small and balance with each other to orient the magnetization of the sense layer structure 228 in a longitudinal direction parallel to the ABS.

When a sense current flows in a direction perpendicular to planes of the CPP TMR read sensor 201, the CPP TMR read sensor 201 acts as if it is a series circuit. Since the Mg—O, MgO or MgO$_X$ barrier layer 210 exhibits an electrical resistivity higher than $1\times10^5$ μΩ-cm while all the other metallic layers lower than 200 μΩ-cm, it acts as the highest-resistance path in the series circuit. The areal resistance of the CPP TMR read sensor 201 can thus be characterized by a product of junction resistance and area ($R_J A_J$). When the sense current quantum-jumps across the barrier layer 210 and a magnetic field rotates the magnetization of the sense layer structure 228 from the same direction as that of the reference layer structure 224 to an opposite direction, coherent scattering of conduction electrons at lower and upper interfaces of the barrier layer 210 induces a TMR effect and causes an increase in the electrical resistance from $R_J$ to $R_J+\Delta R_T$. The strength of this TMR effect can be characterized by a TMR coefficient ($\Delta R_T/R_J$).

Since the Ta buffer layer 216 is nonmagnetic, it acts as a portion of the read gap, and its lower interface thus defines the lower bound of the read gap. Since the Ta buffer layer 216 exhibits a body-centered-cubic (bcc) structure while the Ni—Fe lower shield 206 exhibits a face-centered-cubic (bcc) structure, the Ta buffer layer 216 reduces microstructural effects of the Ni—Fe lower shield 206 on the CPP TMR read sensor 201.

Since the Ru seed layer 218 exhibits a hexagonal-closed-packed (hcp) structure (which is formed of two types of closest-packed monolayers) which is distinctly different from the bcc structure, the Ru seed layer 218 grows with crystalline textures affected by the Ta buffer layer 216. Since the Ir—Mn pinning layer 220 exhibits an fcc structure (which is formed of three types of closest-packed monolayers) similar to the hcp structure, the Ru seed layer 218 develops an epitaxial relationship with the Ir—Mn pinning layer 220, and thus facilitates the Ir—Mn pinning layer 220 to grow with preferred crystalline textures needed for a high $H_{UA}$.

Figure 3:
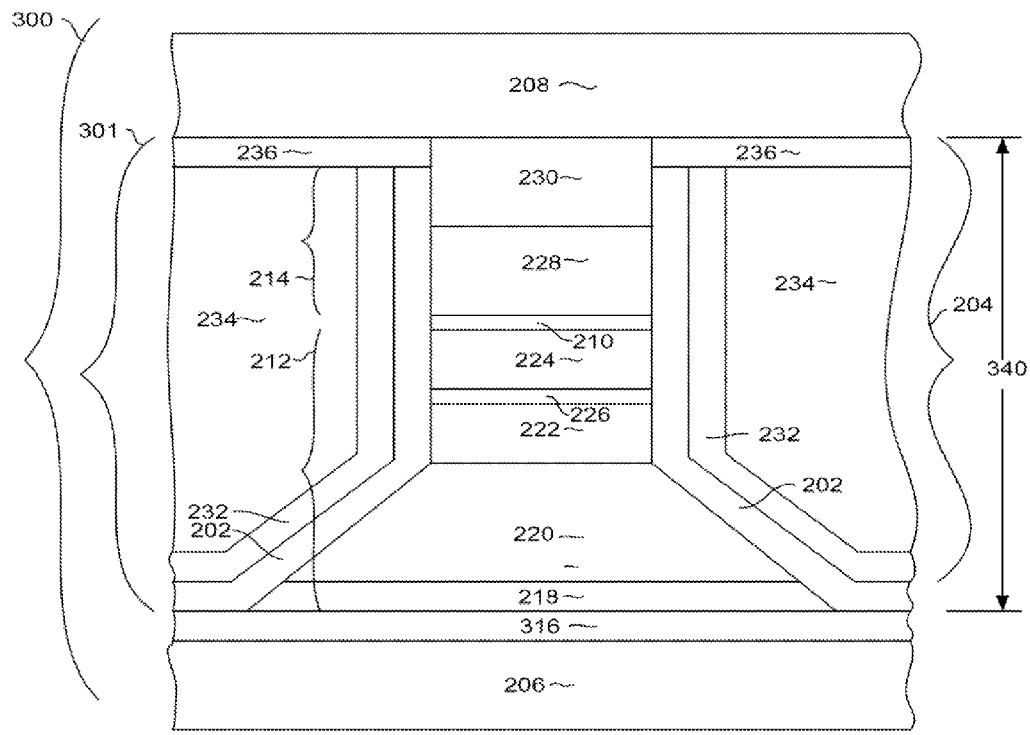
FIG. 3 is an ABS schematic view of another embodiment of a read head in accordance with the prior art.

FIG. 3 illustrates an ABS view of another read head 300 in accordance with the prior art, which is similar to the read head 200 except that the buffer layer 316 of the CPP TMR read sensor 301 is formed of a 2 nm thick ferromagnetic 76.2Co-23.8Hf film, and is extended from the read region into the two side regions. The buffer layer 316 contains a Hf content high enough for Hf atoms of 0.216 nm in radius, which are much larger than Co atoms of 0.167 nm in radius, to severely interfere with the ability of the Co atoms to crystallize, while still allowing the buffer layer 316 to remain ferromagnetic. As a result, the buffer layer 316 is amorphous but still ferromagnetic.

Since the Co—Hf buffer layer 316 is amorphous, it eliminates microstructural effects of the Ni—Fe lower shield 206 on the CPP TMR read sensor 301, and establishes a fresh foundation for the Ru seed layer 218 to grow freely with its own preferred crystalline textures and develop the epitaxial relationship with the Ir—Mn pinning layer 220. Since the Co—Hf buffer layer 316 is ferromagnetic, it acts as an auxiliary lower shield, and its upper interface thus defines the lower bound of the read gap 340.

As shown in FIGS. 2 and 3, by replacing the 2 nm thick nonmagnetic Ta buffer layer 216 with the 2 nm thick ferromagnetic Co—Hf buffer layer 316, the read gap 340 is 2 nm thinner than the read gap 240. To apply this approach to the CPP TMR read sensor 301, it is crucial to ensure that this replacement will not deteriorate its magnetic properties (i.e., $H_{CE}$, $H_{UA}$, $H_{BA}$, $H_C$, $H_F$, etc.) and TMR properties (i.e., $R_J A_J$, $\Delta R_T/R_J$, etc.) before and after the sensor operation at elevated temperatures. The feasibility of this approach is assessed as described below.

A buffer layer formed of a 2 nm thick Ta, 76.2Co-23.8Hf or 65.5Co-19.9Fe-14.6B film, a seed layer formed of a 2 nm thick Ru or Pt film, a pinning layer 220 formed of a 6 nm thick antiferromagnetic 21.7Ir-78.3Mn film, a keeper layer 222 formed of a 3.6 nm thick ferromagnetic 77.5Co-22.5Fe film with a saturation of 0.56 memu/cm$^2$ (corresponding to that of a 8 nm thick ferromagnetic 88Ni-12Fe film sandwiched into two Cu films), and a cap layer structure formed of Ru(2)/Ta(2)/Ru(4) films are sequentially deposited on a bare glass substrate and annealed for 5 hours at 280° C. in a magnetic field of 50,000 Oe. Magnetic responses of the films are then detected with a vibrating sample magnetometer (VSM) by applying a magnetic field to the films in a direction parallel or antiparallel to the easy axis of the Co—Fe keeper layer 222, in order to determine $H_C$ and $H_{UA}$.

The films are then baked for 5 minutes at a series of baking temperatures ($T_B$) in a magnetic field of 5,000 Oe that is antiparallel to the easy axis of the Co—Fe keeper layer 222, in order to simulate a disk drive environment where the CPP TMR read sensor operates at elevated temperatures. Resistance responses of the films are then detected with a four-point probe by applying a sense current to the films in a direction perpendicular to the easy axis of the Co—Fe keeper layer 222 and a magnetic field to the films in a direction parallel or antiparallel to the easy axis, in order to determine $H_C$ and $H_{UA}$ after cooling from each $T_B$.

Figure 4:
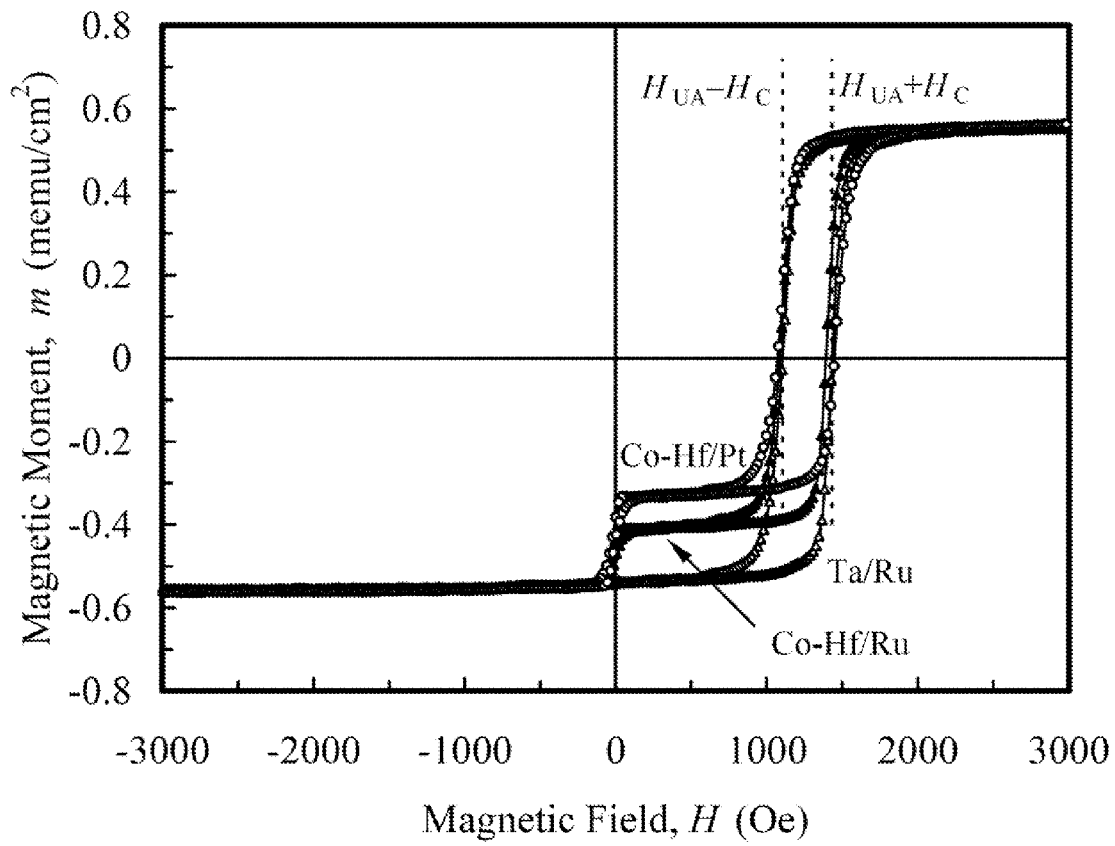
FIG. 4 is a chart showing easy-axis magnetic responses of Ir—Mn/Co—Fe films with various buffer and seed layers after annealing for 5 hours at 280° C.

FIG. 4 shows easy-axis magnetic responses of the Ir—Mn/Co—Fe films with various buffer and seed layers after annealing for 5 hours at 280° C. Two types of hysteresis loops are identified, one centered and the other shifted. The centered hysteresis loop originates from easy-axis magnetic responses of the ferromagnetic Co—Hf buffer layer 316 that is exchange-decoupled by the nonmagnetic Ru or Pt seed layer 218 from the antiferromagnetic Ir—Mn pinning layer 220. Due to this exchange decoupling, the ferromagnetic Co—Hf buffer layer 316 can act freely as an auxiliary lower shield. In addition, the centered hysteresis loops reveal that the saturation magnetic moments of the Co—Hf buffer layer 316 beneath the Ru and Pt seed layers 218 are 0.08 and 0.14 memu/cm$^2$, respectively (corresponding to those of 0.11 and 0.2 nm thick ferromagnetic 88Ni-12Fe film sandwiched into two Cu films, respectively). The magnetic moment loss at an interface between the Co—Hf buffer layer 316 and the Ru seed layer 218 appears much larger than that at an interface between the Co—Hf buffer layer 316 and the Pt seed layer 218.

On the other hand, the shifted hysteresis loop originates from easy-axis magnetic responses of the ferromagnetic Co—Fe keeper layer 222 which exchange-couples with the antiferromagnetic Ir—Mn pinning layer 220. As the magnetic field antiparallel to the easy axis of the Co—Fe keeper layer 222 increases to $H_{UA}+H_C$, it rotates the magnetization of the Co—Fe keeper layer 222 by 180° to the field direction and thus the magnetic moment of the Co—Fe keeper layer 222 increases from the minimal to maximal values. As the antiparallel magnetic field decreases to $H_{UA}-H_C$, the magnetization of the Co—Fe keeper layer 222 becomes free and rotates by 180° again to its original direction, and thus the magnetic moment decreases from the maximal to minimal values. As a result, a shifted hysteresis loop is formed, and the antiferromagnetic/ferromagnetic coupling occurring between the Ir—Mn pinning layer 220 and the Co—Fe keeper layer 222 is detected. The half width and the shift of the shifted hysteresis loop determine $H_C$ and $H_{UA}$, respectively. The extrinsic strength of the antiferromagnetic/ferromagnetic coupling, which is expressed by $H_{UA}$, can be converted into an intrinsic strength by defining an antiferromagnetic/ferromagnetic coupling energy ($J_K$), which is a product of $H_{UA}$, the saturation magnetization (Ms) of the Co—Fe keeper layer 222 and its thickness ($\delta_{CF}$). He values of the Ir—Mn/Co—Fe films with Ta buffer/Ru seed, Co—Hf buffer/Ru seed and Co—Hf buffer/Pt seed layers are determined from FIG. 4 to be 163.9, 145.5 and 179.8 Oe, respectively, and $H_{UA}$ values 1,269, 1,256 and 1,288 Oe, respectively (corresponding to $J_K$ values of 0.707, 0.694 and 0.724 erg/cm², respectively).

Figure 5:
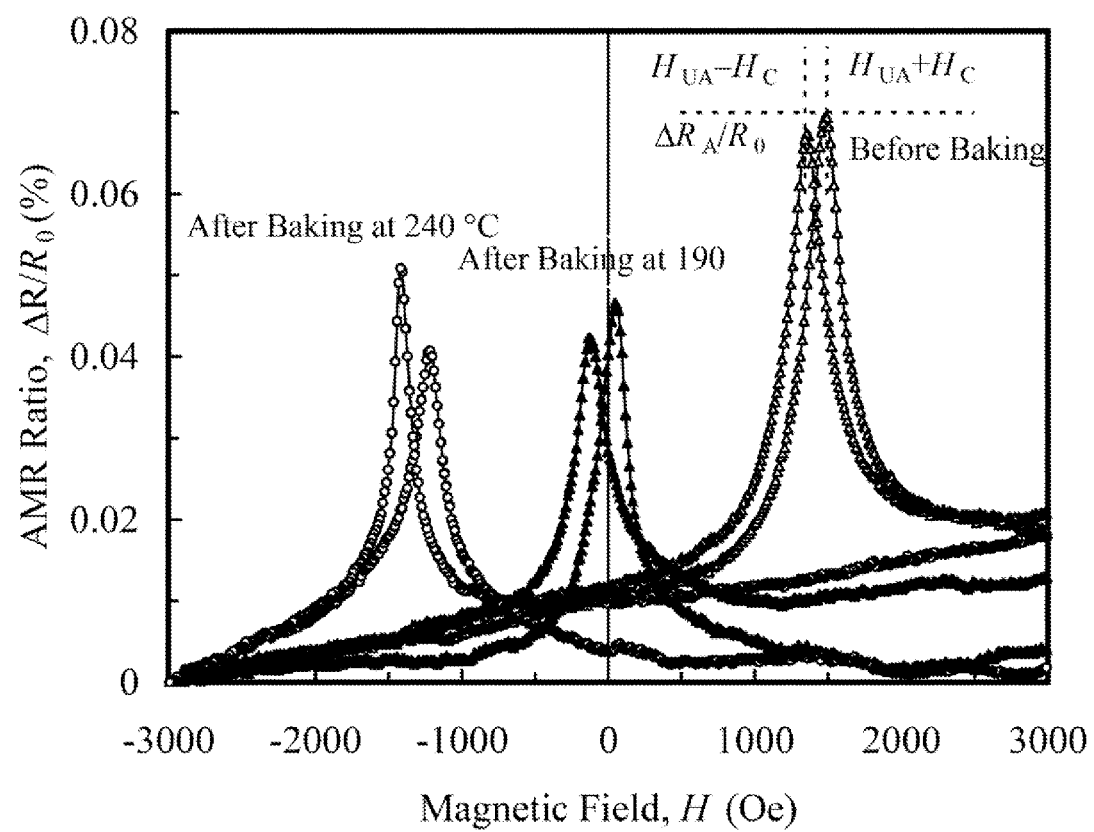
FIG. 5 is a chart showing easy-axis resistance responses of Ir—Mn/Co—Fe films with various buffer and seed layers before baking and after baking at 190 and 240° C.

FIG. 5 shows easy-axis resistance responses of the Ir—Mn/Co—Fe films with various buffer and seed layers before and after baking at 190 and 240° C. Due to an anisotropy magnetoresistance (AMR) effect, the resistance varies in proportion to the magnitude of the magnetic field and $\cos^2 \theta'$, where $\theta'$ is an angle between the sense current and $M_S$. When a magnetic field rotates $M_S$ from a direction perpendicular to the sense current by 90° to another direction parallel or antiparallel to the sense current, the AMR effect occurs and causes an increase in the electrical resistance from the minimal value ($R_0$) to the maximal value ($R_0+\Delta R_A$). The strength of this AMR effect can thus be characterized by an AMR coefficient ($\Delta R_A/R_0$).

As the antiparallel magnetic field increases to $H_{UA} H_C$, it rotates $M_S$ by 180° to the field direction. During this $M_S$ rotation, the resistance of the films increases from $R_0$ when $M_S$ is perpendicular to the sense current, to $R_0+\Delta R_A$ when $M_S$ is parallel or antiparallel to the sense current, and then to $R_0$ again when $M_S$ is perpendicular to the sense current again. On the other hand, as the antiparallel magnetic field decreases to $H_{UA}-H_C$, $M_S$ becomes free and rotates by 180° again to its original direction. During this $M_S$ rotation, the resistance of the films increases from $R_0$ when $M_S$ is perpendicular to the sense current, to $R_0+\Delta R_A$ when $M_S$ is parallel or antiparallel to the sense current, and then to $R_0$ again when $M_S$ is perpendicular to the sense current again. As a result, two peaks exhibiting $R_0+\Delta R_A$ are formed, and the antiferromagnetic/ferromagnetic coupling occurring between the Ir—Mn pinning layer 220 and the Co—Fe keeper layer 222 is detected. The half distance and the midpoint between the two peaks define $H_C$ and $H_{UA}$, respectively. In spite of $\Delta R_0/R_\perp$ being as low as below 0.07%, the two peaks can be clearly observed, and $H_C$ and $H_{UA}$ can be precisely defined. Since the resistance measurement is much faster than the magnetic measurement, this method appears more effective when conducting a long series of measurements.

Figure 6:
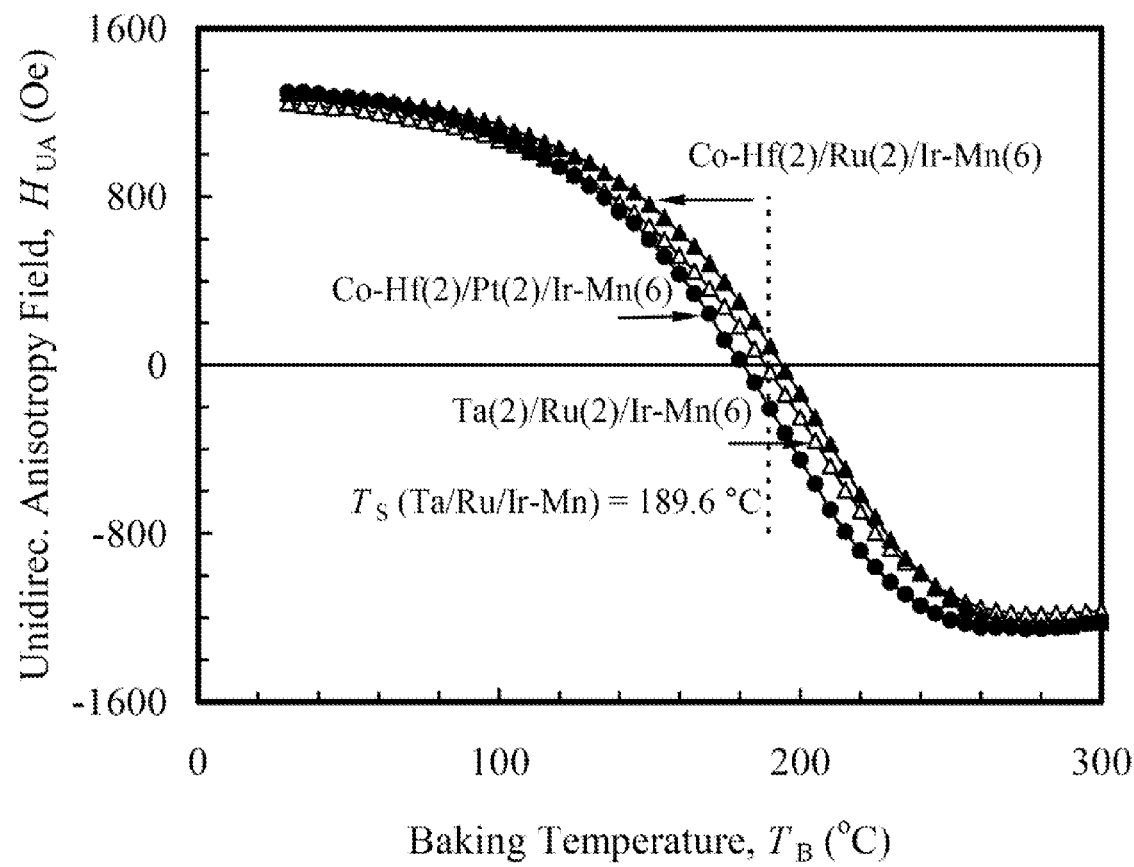
FIG. 6 is a chart showing $H_{UA}$ determined from easy-axis resistance responses versus $T_B$ for Ir—Mn/Co—Fe films with various buffer and seed layers before and after baking at $T_B$.

FIG. 6 shows $H_{UA}$ determined from the easy-axis resistance responses versus for the Ir—Mn/Co—Fe films with various buffer and seed layers before and after baking at $T_B$. As $T_B$ increases, $H_{UA}$ decreases from the maximum value to zero, and then to the minimal value. This phenomenon can be explained by an exchange coupling model, where an ensemble of various local exchange coupling elements exist at an interface between antiferromagnetic and ferromagnetic films, and each exchange coupling element exhibits its own local blocking temperature at which an antiparallel field will switch its magnetization by 180° towards the magnetic field. A critical temperature, at which the antiparallel field has switched the magnetizations of 50% of the exchange coupling elements, is defined as a switch temperature ($T_S$). A higher $T_S$ thus indicates more robust thermal stability. $T_S$ values of the Ir—Mn/Co—Fe films with Ta buffer/Ru seed, Co—Hf buffer/Ru seed and Co—Hf buffer/Pt seed layers are determined from FIG. 6 to be 189.6, 195.5 and 181.5° C., respectively.

Table 1 summarizes $H_C$, $H_{UA}$, $J_K$ and $T_S$ determined from the easy-axis magnetic and resistance responses of the Ir—Mn/Co—Fe films with various buffer and seed layers before and after baking at in accordance with the prior art. $J_K$ remains high when the ferromagnetic Co—Hf buffer layer 316 replaces the nonmagnetic Ta buffer layer 216, but substantially decreases when the ferromagnetic Co—Fe—B buffer layer replaces the nonmagnetic Ta buffer layer 216. On the other hand, $T_S$ substantially increases when the ferromagnetic Co—Hf buffer layer 316 replaces the nonmagnetic Ta buffer layer 216, but substantially decreases when the ferromagnetic Co—Fe—B buffer layer replaces the nonmagnetic Ta buffer layer 216 or the nonmagnetic Pt seed layer replaces the nonmagnetic Ru seed layer 218. Therefore, it is feasible to reduce the read gap by 2 nm by replacing the nonmagnetic Ta buffer layer 216 with the ferromagnetic Co—Hf buffer layer 316. Since the Pt and Ru seed layers have advantages on $J_K$ and $T_S$, respectively, uses of dual Pt and Ru seed layers are explored and proposed in the invention, as described below.

TABLE 1

| Ferromagnetic Buffer Layer | Nonmagnetic Seed Layer | $H_{CE}$ (Oe) | $H_{UA}$ (Oe) | $J_K$ (erg/cm²) | $T_S$ (° C.) |
|---|---|---|---|---|---|
| None | Ta(2)/Ru(2) | 163.9 | 1269.4 | 0.707 | 189.6 |
| Co—Hf(2) | Ru(2) | 145.5 | 1255.5 | 0.694 | 195.5 |
| Co—Hf(2) | Pt(2) | 179.8 | 1287.5 | 0.724 | 181.5 |
| Co—Fe—B(2) | Ru(2) | 158.6 | 958.8 | 0.529 | 170.2 |
| Co—Fe—B(2) | Pt(2) | 141.2 | 1186.4 | 0.665 | 172.1 |

Preferred Embodiment

Figure 7:
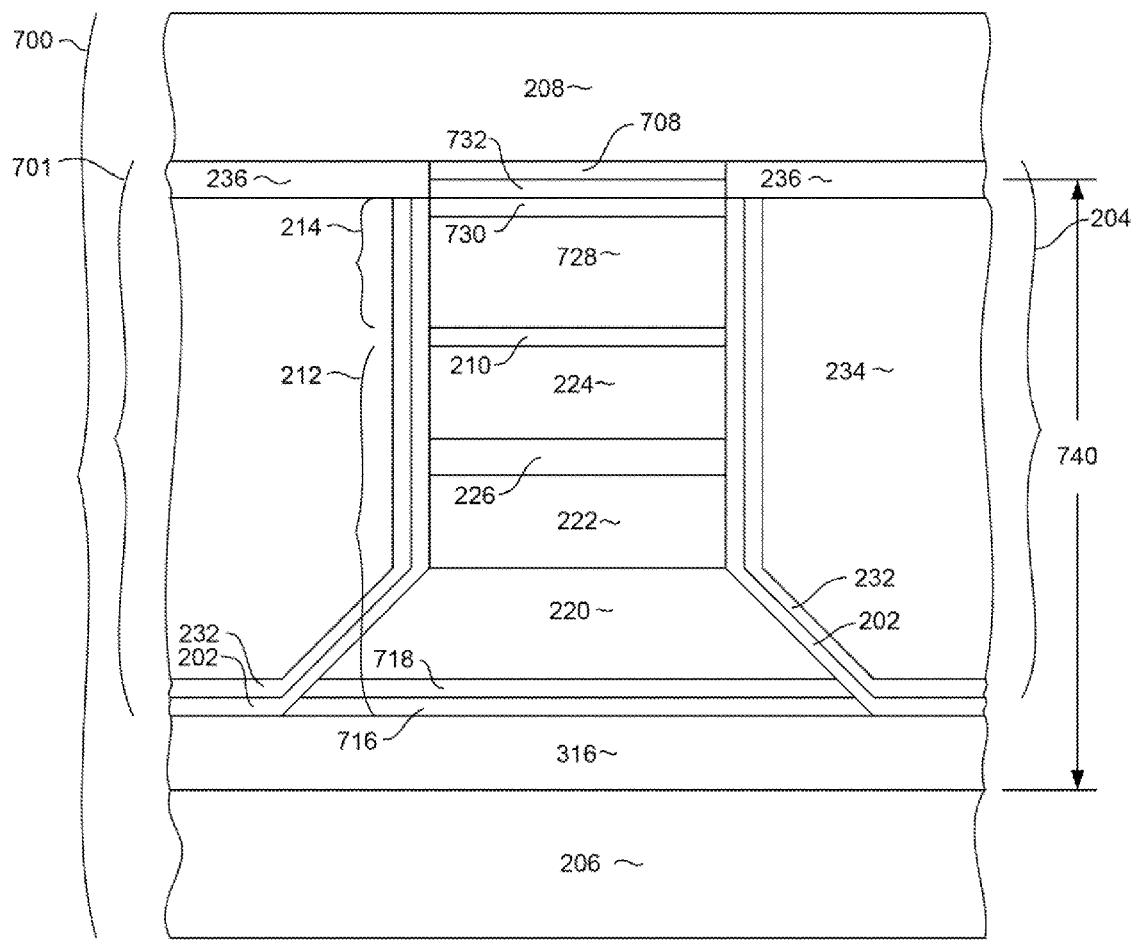
FIG. 7 is an ABS schematic view of a read head in accordance with a preferred embodiment of the invention.

FIG. 7 illustrates an ABS view of a read head 700 in accordance with a preferred embodiment of the invention, which is similar to the read head 300 except that dual seed layers comprising a lower seed layer 716 and an upper seed layer 718 are sandwiched between the buffer layer 316 and the pinning layer 220, while dual cap layers comprising a lower cap layer 730 and an upper cap layer 732 are sandwiched between a sense layer structure 728 and an upper auxiliary shield 708 that acts as if the upper shield 208. The lower seed layer 716 is preferably formed of a nonmagnetic Pt film having a thickness of 0.4 nm, and the upper seed layer 718 is preferably formed of a nonmagnetic Ru film having a thickness of 0.8 nm. The lower cap layer 730 is preferably formed of a nonmagnetic Pt film having a thickness of 0.4 nm, the upper cap layer 732 is preferably formed of a nonmagnetic Ru film having a thickness of 0.4 nm, and the upper auxiliary shield 708 is preferably formed of a ferromagnetic 80Ni-20Fe (composition in atomic percent) film having a thickness of 2 nm.

Key merits proposed in the preferred embodiment of the invention are low magnetic moment losses of the buffer layer 316 and the upper sense layer of the sense layer structure 728. With the low magnetic moment losses, the buffer layer 316 can exhibit high permeability, thus effectively acting as a lower auxiliary shield and clearly defining the lower bound of the read gap with its upper interface, while the upper sense layer can be thin but still facilitate the sense layer structure 728 to attain a designed sense layer moment, thus reducing the read gap for high-resolution magnetic recording. The low magnetic moment losses originate from mild atomic mixing at an interface between the buffer layer 316 and the lower seed layer 716, and at another interface between the upper sense layer and the lower cap layer 730. In order to ensure the low magnetic moment losses through the mild atomic mixing, ion bombardments on the buffer layer 316 and on the upper sense layer during depositions of the lower seed layer 716 and the lower cap layer 730, respectively, can be reduced by utilizing a "cold" DC sputtering mode (instead of a "hot" ion-beam sputtering mode) or mild sputtering parameters (such as a long traveling distance from a target to a substrate, a low target power, a high process pressure, etc.), as described below.

Figure 8:
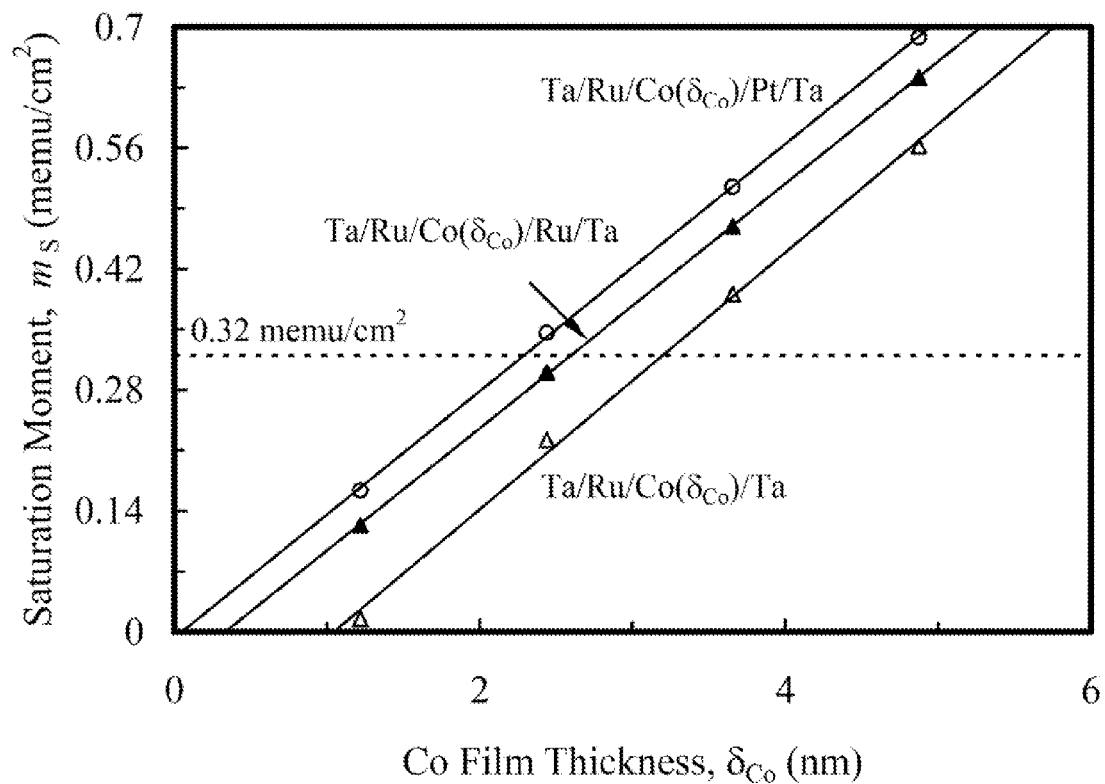
FIG. 8 is a chart showing the saturation moment ($m_s$) versus the thickness ($\delta_{Co}$) of Co films sandwiched between seed layers formed of Ta(2)/Ru(2) films and cap layers formed of Ta(4), Ru(2)/Ta(2) or Pt(2)/Ta(2) films after annealing for 5 hour at 280° C.

FIG. 8 shows the saturation magnetic moment ($m_s$) versus the thickness ($\delta_{Co}$) of Co films sandwiched between seed layers formed of Ta(2)/Ru(2) films and cap layers formed of Ta(4), Ru(2)/Ta(2) or Pt(2)/Ta(2) films after annealing for 5 hour at 280° C. The Co films in contact with the Ta, Ru and Pt cap layers start to exhibit magnetic moments at threshold thicknesses of 1.1, 0.4 and 0.1 nm, respectively. The threshold thickness includes lower and upper threshold thicknesses, exceeding which the Co film overcomes moment losses caused by the atomic mixing after deposition and diffusion after annealing at its lower and upper interfaces, respectively, and starts to exhibit magnetic moments. By subtracting a lower threshold thickness of 0.2 nm (determined based on an assumption that the Co film in contact with the Ru seed and cap layers exhibits identical magnetic moment losses), the Co films in contact with the Ta, Ru and Pt cap layers exhibit upper threshold thicknesses 40.9, 0.2 and −0.1 nm, respectively. A negative upper threshold thickness may indicate a magnetic moment gain.

Figure 9:
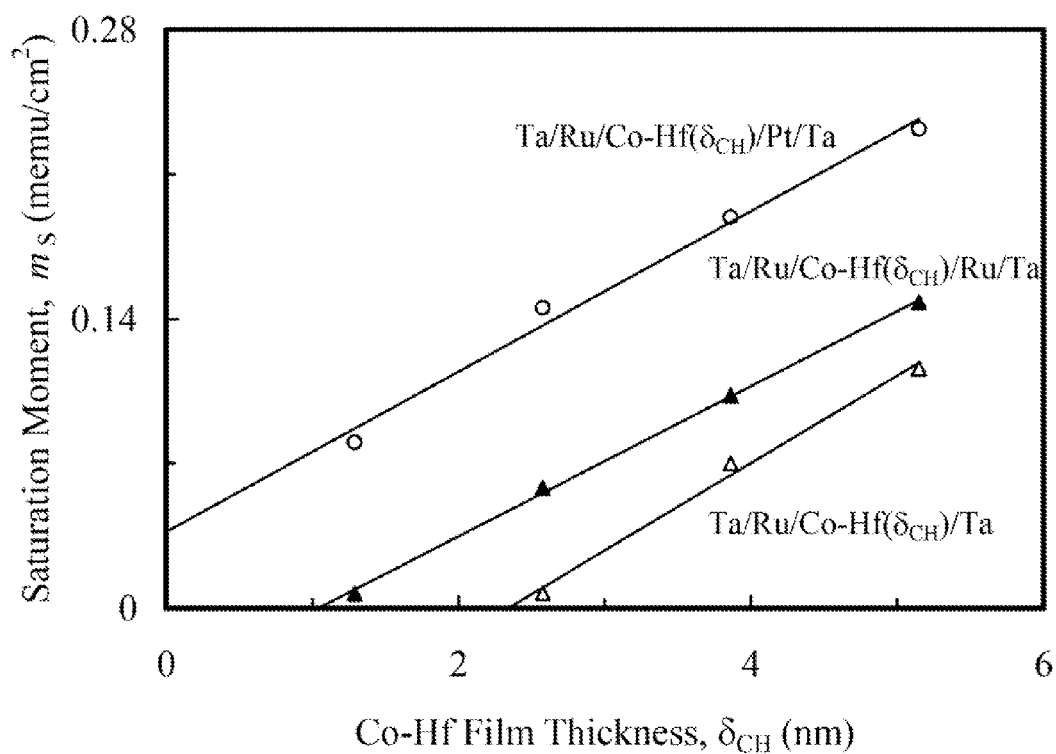
FIG. 9 is a chart showing the saturation magnetic moment ($m_s$) versus the thickness ($\delta_{CH}$) for the 76.7Co-23.3Hf films sandwiched between seed layers formed of Ta(2)/Ru(2) films and cap layers formed of Ta(4), Ru(2)/Ta(2) or Pt(2)/Ta(2) films after annealing for 5 hours at 280° C.

FIG. 9 shows the saturation magnetic moment ($m_s$) versus the thickness ($\delta_{CH}$) of the 76.7Co-23.3Hf films sandwiched between seed layers formed of Ta(2)/Ru(2) films and cap layers formed of Ta(4), Ru(2)/Ta(2) or Pt(2)/Ta(2) films after annealing for 5 hours at 280° C. The Co—Hf films in contact with the Ta, Ru and Pt cap layers start to exhibit magnetic moments at threshold thicknesses of 2.4, 1.1 and −0.9 nm, respectively. By subtracting a lower threshold thickness of 0.55 nm (determined based on an assumption that the Co—Hf film in contact with the Ru seed and cap layers exhibits identical magnetic moment losses), the Co—Hf films in contact with the Ta, Ru and Pt cap layers exhibit upper threshold thicknesses of 1.95, 0.55 and −1.45 nm, respectively FIGS. 8 and 9 indicate that the use of the Pt cap layer leads to the smallest upper threshold thickness, and thus leads to the least magnetic moment loss. This finding in fact has been shown in FIG. 4, and is confirmed in FIGS. 8 and 9. For example, as shown in FIG. 9, 2.6 nm thick Co—Hf films in contact with the Ta, Ru and Pt cap layers exhibit $m_s$ of 0.01, 0.06 and 0.14 memu/cm², respectively (corresponding to those of 0.1, 0.8, 2.0 nm thick ferromagnetic 88Ni-12Fe film sandwiched into two Cu films, respectively).

Therefore, by replacing the Ru seed layer in contact with the Co—Hf buffer layer with the Pt seed layer, $m_S$ increases by 0.08 memu/cm² (corresponding to that of 1.2 nm thick ferromagnetic 88Ni-12Fe film sandwiched into two Cu films, respectively). In addition, as shown in FIGS. 4, 6 and Table 1, this replacement also leads to a slight increase in $J_K$ by 0.03 erg/cm², but a substantial decrease in $T_S$ by 14° C. It is thus proposed in the preferred embodiment of the invention to use the Pt lower seed layer 716 for the highest $m_S$ and $J_K$, and the Ru upper seed layer 718 for the highest $T_S$.

Figure 10:
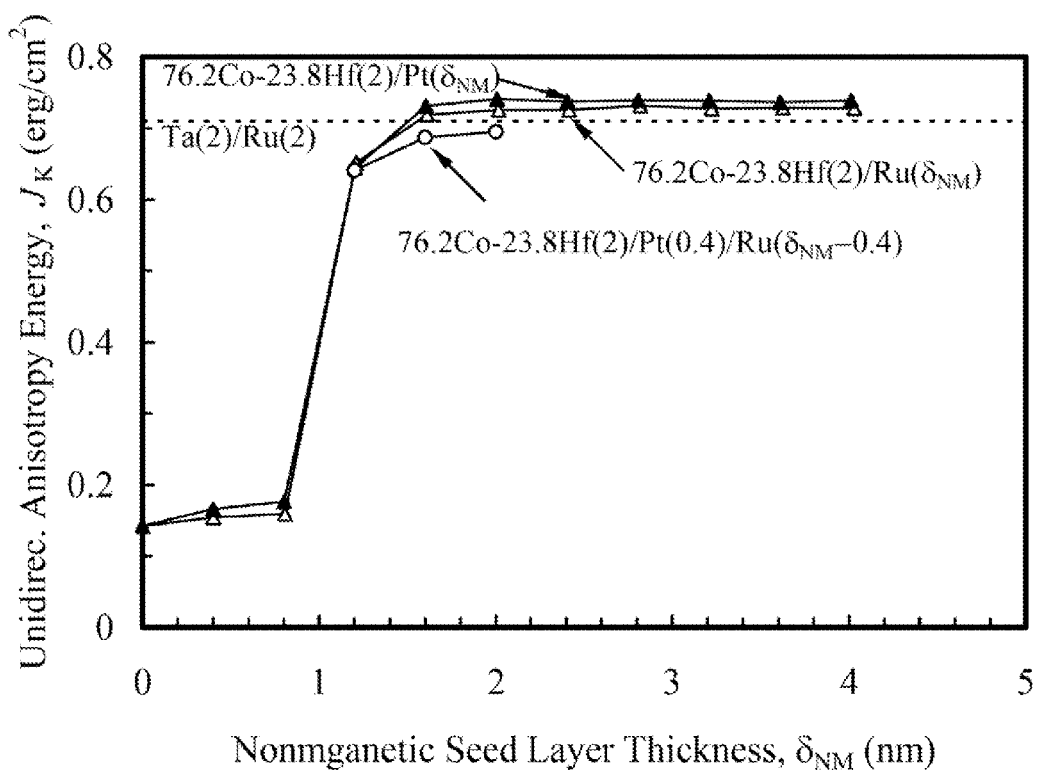
FIG. 10 is a chart showing $J_K$ versus the nonmagnetic seed layer ($\delta_{NM}$) for Co—Hf(2)/Ru($\delta_{NM}$)/Ir—Mn(6)/Co—Fe(3.6), Co—Hf(2)/Pt($\delta_{NM}$)/Ir—Mn(6)/Co—Fe(3.6), and Co—Hf(2)/Pt(0.4)/Ru($\delta_{NM}$-0.4)/Ir—Mn(6)/Co—Fe(3.6) films with Ru(2)/Ta(2)/Ru(4) cap layers after annealing for 5 hours at 280° C.

Since the dual seed layers in accordance with the preferred embodiment of the invention act as portions of the read gap, their total thickness must not exceed the Ru or Pt seed layer 218 in accordance with the prior art, in order to ensure high-resolution magnetic recording. FIG. 10 shows $J_K$ versus the nonmagnetic seed layer ($\delta_{NM}$) for Co—Hf(2)/Ru($\delta_{NM}$)/Ir—Mn(6)/Co—Fe(3.6), Co—Hf(2)/Pt($\delta_{NM}$)/Ir—Mn(6)/Co—Fe(3.6), and Co—Hf(2)/Pt(0.4)/Ru($\delta_{NM}$-0.4)/Ir—Mn(6)/Co—Fe(3.6) films with Ru(2)/Ta(2)/Ru(4) cap layers after annealing for 5 hours at 280° C. In all the three cases, $\delta_{NM}$ must be at least 1.2 nm to exhibit an acceptable of 0.64 erg/cm². Therefore, the replacement of the Ru or Pt seed layer 218 with the dual seed layers does not change the minimal $\delta_{NM}$ requirement.

Figure 11:
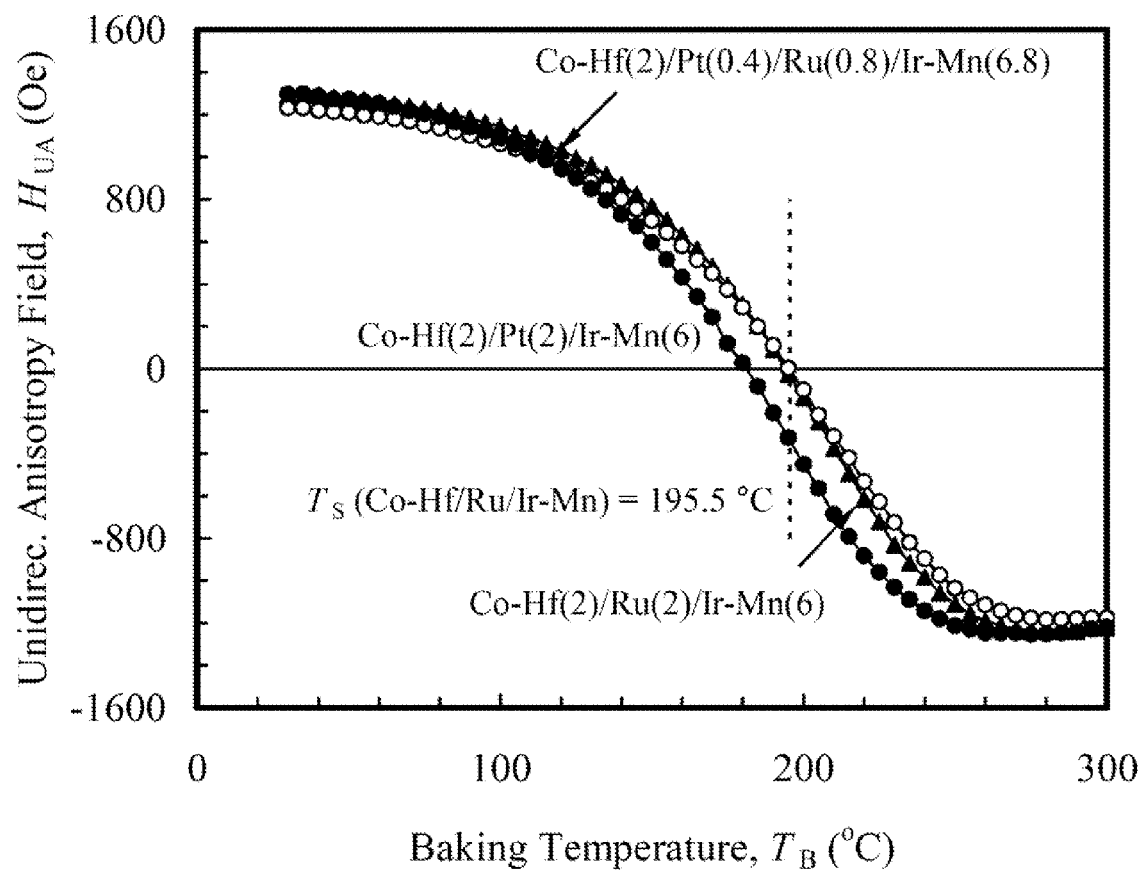
FIG. 11 is a chart showing $H_{UA}$ determined from the easy-axis resistance responses versus $T_B$ for Co—Hf(2)/Ru(2)Ir—Mn(6)/Co—Fe(3.6), Co—Hf(2)/Pt(2)/Ir—Mn(6)/Co—Fe(3.6), and Co—Hf(2)/Pt(0.4)/Ru(0.8)/Ir—Mn(6.8)/Co—Fe(3.6) films with Ru(2)/Ta(2)/Ru(4) cap layers before and after baking at $T_B$.

FIG. 11 shows $H_{UA}$ determined from the easy-axis resistance responses versus $T_B$ for Co—Hf(2)/Ru(2)Ir—Mn(6)/Co—Fe(3.6), Co—Hf(2)/Pt(2)/Ir—Mn(6)/Co—Fe(3.6), and Co—Hf(2)/Pt(0.4)/Ru(0.8)/Ir—Mn(6.8)/Co—Fe(3.6) films with Ru(2)/Ta(2)/Ru(4) cap layers before and after baking at $T_B$. $T_S$ values of the Ir—Mn/Co—Fe films with Ru, Pt and Pt/Ru seed layers are determined to be 195.5 181.5 and 196.0° C., respectively. The Ru upper seed layer 718 and the slightly thicker Ir—Mn pinning layer 220 thus facilitate the Pt lower seed layer 716 to increase is by 14.5° C. and thus to exceed a desired $T_S$ of 189.6° C.

In the fabrication process of the read head 700 in accordance with the preferred embodiment of the invention 76.7Co-23.3Hf(2)/Pt(0.4)/Ru(0.8)/23.2Ir-76.8Mn(6.8) films are deposited on a bare glass substrate and on a wafer with a 1 μm thick ferromagnetic Ni—Fe lower shield 206 in a first module of a sputtering system, and 72.5Co-27.5Fe(1.6)/Co(0.6)/Ru(0.4)/Co(0.6)/75.5Co-24.5Hf(0.6)/65.5Co-19.9Fe-14.6B(1.3) films are then sequentially deposited in a second module of the sputtering system. After applying a plasma treatment for 72 seconds at a substrate power of 20 W to partially remove the Co—Fe—B film by about 0.1 nm and to smoothen the surface of the lower sensor stack 212, a 0.3 nm thick 46.8Co-53.2Fe film is deposited and the $MgO_X$ barrier layer is then formed in a third module of the sputtering system, as described below.

After slightly cleaning a Mg target, a 0.2 nm thick Mg film is DC-deposited from the Mg target, and a light oxygen treatment is then applied for oxygen doping into the Mg film. After heavily cleaning the third module with Ti gettering and slightly cleaning a MgO target, a 0.4 nm thick MgO film is RF-deposited from the MgO target, another 0.2 nm thick Mg film is DC-deposited from the Mg target, and then a heavy oxygen treatment is applied for oxygen doping into the entire $MgO_X$ barrier layer 210.

After the formation of the $MgO_X$ barrier layer 210, 87.5Co-12.5Fe(0.4)/79.3Co-4.0Fe-16.7B(1.6)/87.1Co-12.9Hf(2)/Pt(0.4)/Ru(0.4)/Ni—Fe(8) films are deposited in a fourth module of the sputtering system. After annealing in a magnetic field of 50,000 Oe for 5 hours at 280° C. in a high-vacuum oven, the CPP TMR read sensor 701 is patterned in a photolithographic process to produce sensor front and rear edges, and then patterned again in another photographic process to produce sensor tails at the two side regions. The $Al_2O_3$ insulation layer 202 and the longitudinal bias stack 204 are then deposited into the two side regions. After removing the photoresist, a chemical-mechanical-polishing process is conducted over the entire wafer until the Ni—Fe auxiliary upper shield 708 is partially removed. The CPP TMR read sensor 701, the $Al_2O_3$ insulation layer 202, and the longitudinal bias stack 204 are then covered by the upper shield 208 also formed of a 1 µm thick ferromagnetic 80Ni-20Fe film, and by a gap formed of a 100 nm thick ferromagnetic $Al_2O_3$ film. A read gap 740 is defined by a distance between the lower interface of the Pt seed layer 716 and the upper interface of the Ru cap layer 708. After completing the read head fabrication process, the write head fabrication process starts.

Figure 12:
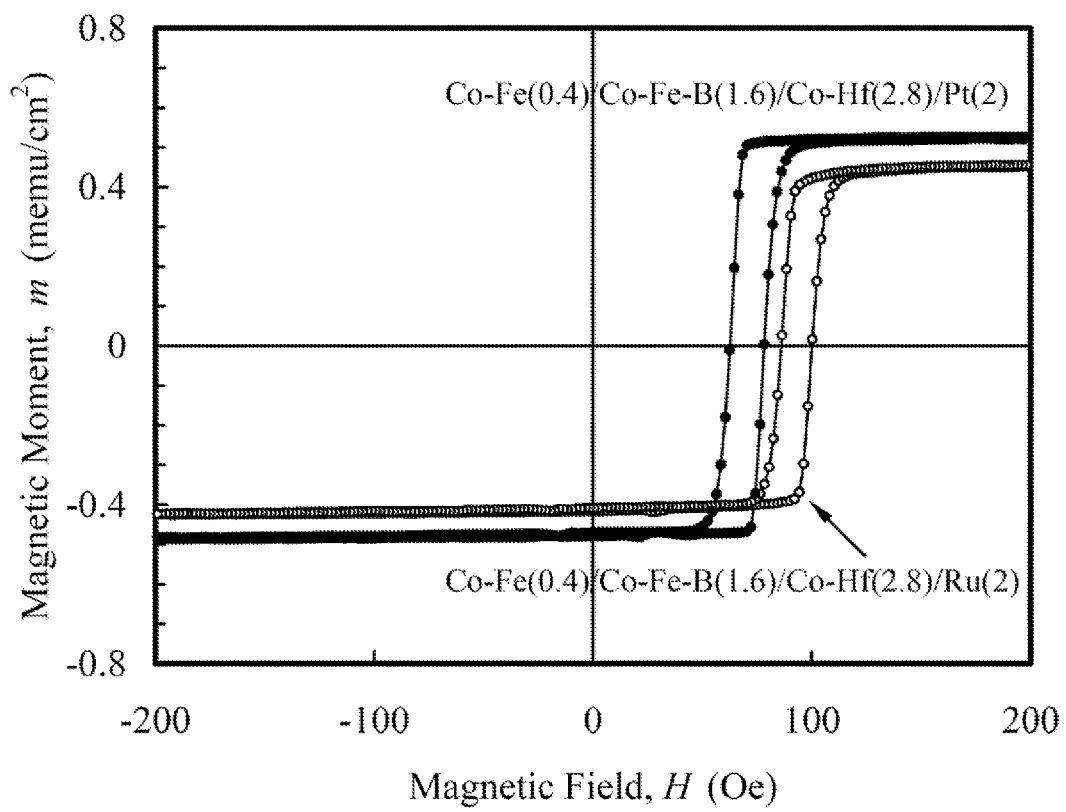
FIG. 12 is a chart showing easy-axis magnetic responses of CPP TMR read sensors comprising Ta(2)/Ru(2)/Ir—Mn(6)/Co—Fe(1.6)/Co(0.6)/Ru(0.4)/Co(0.6)/Co—Hf(0.6)/Co—Fe—B(1.2)/Co—Fe(0.3)/MgO$_X$(0.8)/Co—Fe(0.4)/Co—Fe—B(1.6)/Co—Hf(2.8) films with Ru(2)/Ta(2)/Ru(6) and Pt(2)/Ta(2)/Ru(6) cap layers.

In order to describe advantages found in the preferred embodiment of the invention, a CPP TMR read sensor similar to the sensor 701 but with Ta(2)/Ru(2) seed layers and the Ru or Pt cap layer is formed on the bare glass substrate, and measured with the VSM to characterize magnetic properties. FIG. 12 shows easy-axis magnetic responses of CPP TMR read sensors comprising Ta(2)/Ru(2)/Ir—Mn(6)/Co—Fe (1.6)/Co(0.6)/Ru(0.4)/Co(0.6)/Co—Hf(0.6)/Co—Fe—B (1.2)/Co—Fe(0.3)/MgO$_X$(0.8)/Co—Fe(0.4)/Co—Fe—B (1.6)/Co—Hf(2.8) films with Ru(2)/Ta(2)/Ru(6) and Pt(2)/Ta (2)/Ru(6) cap layers. The Co—Fe/Co—Fe—B/Co—Hf sense layers with the Ru and Pt cap layers exhibit saturation magnetic moments of 0.431 and 0.490 memu/cm$^2$ respectively (corresponding to those of 6.2 and 7.0 nm thick ferromagnetic 88Ni-12Fe films sandwiched into two Cu films). By decreasing the Co—Hf sense layer underneath the Pt cap layer from 2.8 to 2.0 nm, the Co—Fe/Co—Fe—B/Co—Hf sensor layers will exhibit a saturation magnetic moment of 0.43 memu/cm$^2$. Therefore, the replacement of the Ru cap layer with the Pt cap layer will lead to a reduction of the read gap by 0.8 nm for a CPP TMR sensor with a designed sense-layer saturation magnetic moment.

Since the Pt cap layer 730 only needs to be thick enough to reduce the magnetic moment losses, the Ru cap layer 732 can be still deposited on top of the Pt cap layer 730. It is thus proposed to use the Pt/Ru dual cap layers, in order to minimize pinhole densities through interrupted growths of two dissimilar films, and thus enhance ferromagnetic decoupling between the sense layer structure 728 and the Ni—Fe auxiliary upper shield 708. Both the Pt and Ru cap layers 730, 732 can be as thin as 0.4 nm to effectively cause the desired ferromagnetic decoupling. On the other hand, the Ni—Fe auxiliary upper shield 708 can be as thick as 8 nm to protect the CPP TMR read sensor 701 in various processing environments. Its upper portion, which is exposed and might be contaminated during processing, can be removed. Its lower portion, which remains intact, can be used to connect the upper shield 208. As a result, the replacement of the Ru(2)/Ta(2)/Ru(4) cap layers with the Pt(0.4)/Ru(0.4)/Ni—Fe(8) cap layers will lead to a substantial reduction of the read gap by 7.2 nm.

Alternative Embodiment

In order for the buffer layer 316 to effectively act as a lower auxiliary shield, in addition to being amorphous, ferromagnetic and free from magnetic moment losses, it preferably exhibits a high permeability which is proportion to a saturation magnetization ($M_S$) but inversely proportion to a uniaxial anisotropy field ($H_K$). The buffer layer 316 thus requires a high $M_S$ but a low $H_K$ to allow magnetic fluxes stemming from a recording disk to permeate. However, while $M_S$ can be maximized, $H_K$ must be optimized (instead of being minimized) to ensure the permeation without saturation. It is thus suggested to substantially decrease the Hf content of the buffer layer 316 so that $M_S$ is maximized while $H_K$ is optimized. The Hf content of the buffer layer 316, however, might be too low to ensure an amorphous phase which is needed to eliminate a micro-structural effect of the lower shield 206 on the CPP read sensor 701. It is thus proposed in an alternative embodiment of the invention to use dual buffer layers, one having a high Hf content and being amorphous, and the other having a low Hf content and being polycrystalline, as described below.

Figure 13:
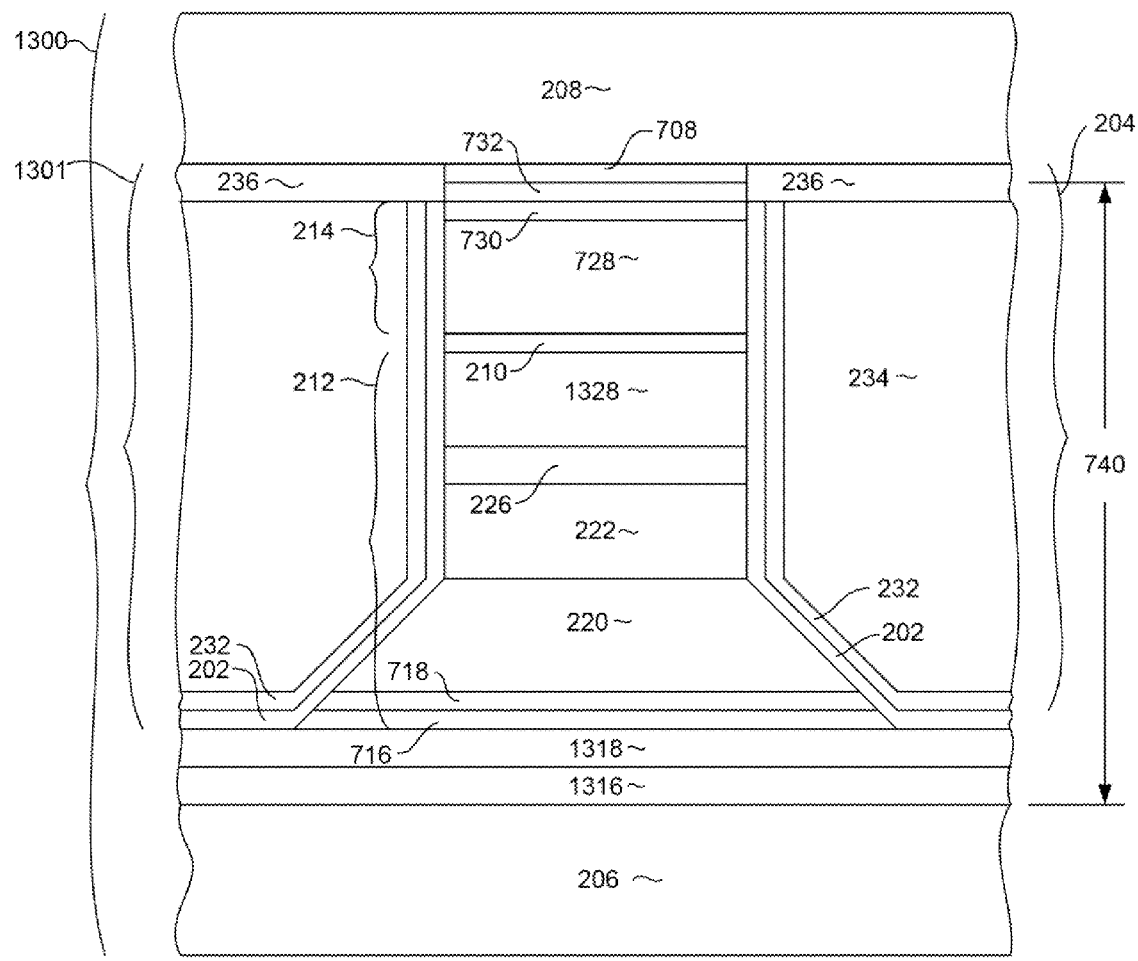
FIG. 13 is a chart illustrating an ABS view of a read head in accordance with an alternative embodiment of the invention.

FIG. 13 illustrates an ABS view of a read head 1300 in accordance with an alternative embodiment of the invention, which is similar to the read head 700 except that dual buffer layers comprising a lower buffer layer 1316 and an upper buffer layer 1318 are sandwiched between the lower shield 206 and the lower seed layer 716. The lower buffer layer 1316 is preferably formed of a ferromagnetic, amorphous Co—Hf film with a Hf content ranging from 6 to 24 at % and a thickness ranging from 0.4 to 2 nm. The upper buffer layer 1318 is preferably formed of a ferromagnetic, polycrystalline Co—Hf film with a Hf content ranging from 2 to 6 at % and a thickness ranging from 0.4 to 4 nm.

Figure 14:
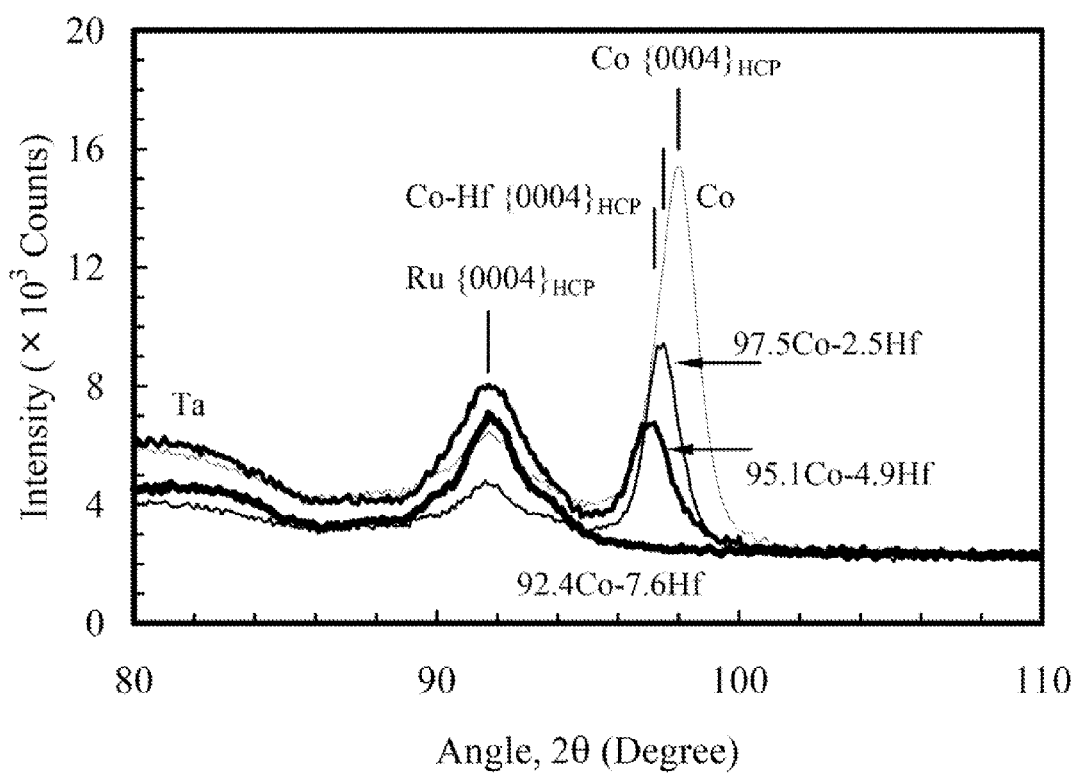
FIG. 14 is a chart showing x-ray diffraction patterns taken from Ta(2)/Ru(2)/Co—Hf(20)/Ru(2)/Ta(2) films after annealing for 5 hours at 280° C.

FIG. 14 shows x-ray diffraction patterns taken from Ta(2)/Ru(2)/Co—Hf(20)/Ru(2)/Ta(2) films after annealing for 5 hours at 280° C. The Co film exhibits a hexagonal-cubic-packed (HCP) structure with a {0004} texture (c-axis parameter=0.4084 nm). As the Hf content increases from 0 to 4.9 at %, the HCP structure with the {0004} texture still remains, but its intensity decreases and the c-axis parameter increases from 0.4084 to 0.4109 nm. As the Hf content increases to 7.6 at % and beyond, the HCP structure becomes amorphous.

Figure 15:
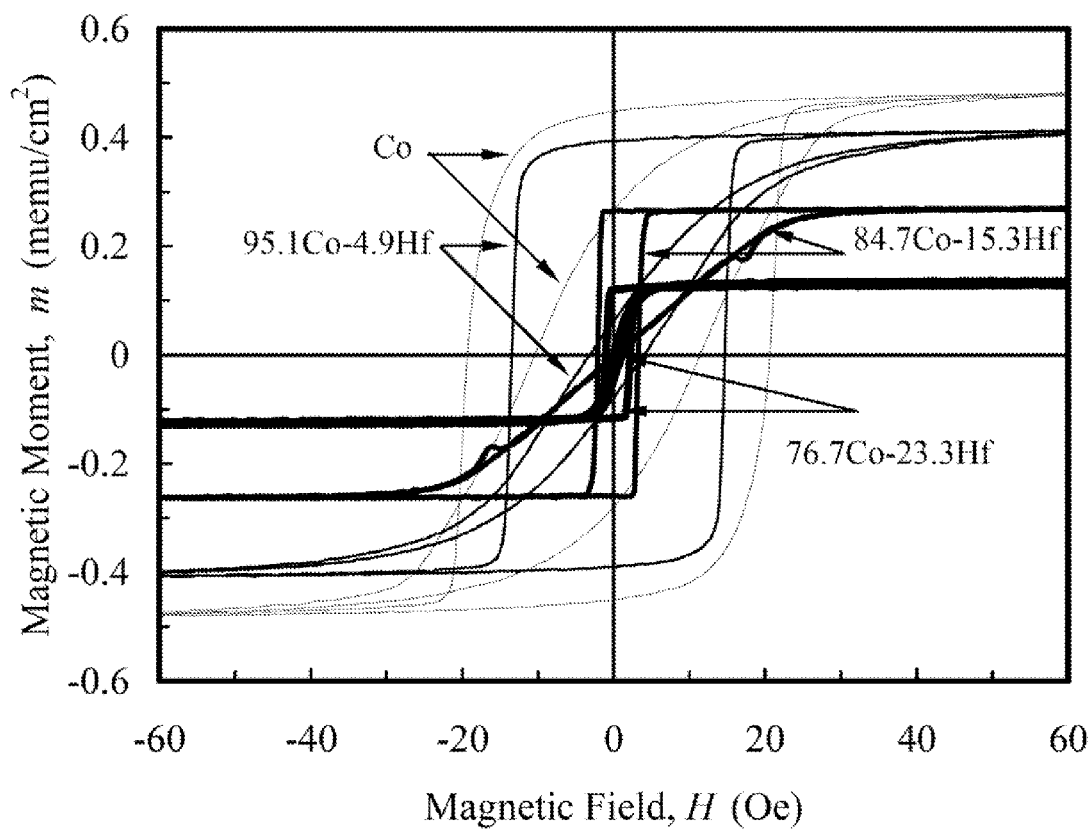
FIG. 15 is a chart showing easy- and hard-axis magnetic responses of Ta(2)/Ru(2)/Co—Hf(4)/Ru(2)/Ta(2)/Ru(4) films after annealing for 5 hours at 280° C.

FIG. 15 shows easy- and hard-axis magnetic responses of Ta(2)/Ru(2)/Co—Hf(4)/Ru(2)/Ta(2)/Ru(4) films after annealing for 5 hours at 280° C. The easy-axis magnetic responses indicate that with the Hf contents of 0, 4.9, 15.3 and 23.3 at %, the Co—Hf films exhibit saturation magnetizations ($M_S$) of 1,453, 1,202, 753 and 410 emu/cm$^3$, respectively, and easy-axis coercivities ($H_{CE}$) of 20.0, 14.1, 2.7 and 1.6 Oe, respectively. The hard-axis magnetic responses indicate that with the Hf contents of 0, 4.9, 15.3 and 23.3 at %, the Co—Hf films exhibit hard-axis coercivities ($H_{CH}$) of 10.9, 3.6, 0.05 and 0.6 Oe, respectively, and uniaxial anisotropy fields ($H_K$) of 20.0, 23.4, 22.8 and 2.7 Oe, respectively. At the Hf content of 15.3 at %, the hard-axis hysteresis loop becomes fully closed, indicating perfect anisotropy.

Figure 16:
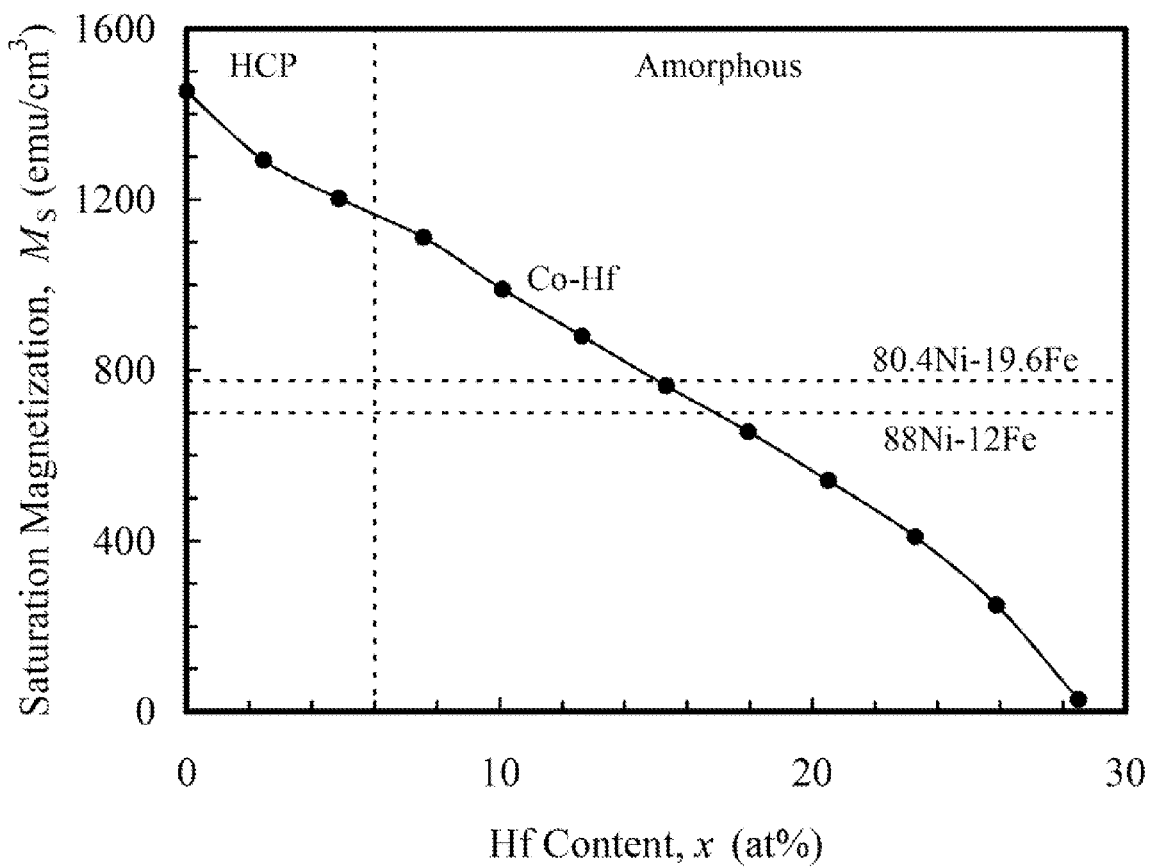
FIG. 16 is a chart showing the saturation magnetization ($M_S$) versus the Hf content.

FIG. 16 shows $M_S$ versus the Hf content of Co—Hf films. As the Hf content increases from 0 to 28.5 at %, $M_S$ decreases nearly monotonically from 1,453 to 28 emu/cm$^3$. In order to activate the Co—Hf buffer layer used as an auxiliary lower shield, its $M_S$ preferably exceeds that of the lower shield 206 formed of a 80.4Ni-19.6Fe film (844 emu/cm$^3$), and thus its Hf content should be lower than 15 at %. However, it should be noted that while the Co—Hf buffer layer with the minimal Hf content may exhibit the maximal $M_S$, it still preferably exhibits an amorphous phase to eliminate micro-structural effects of the lower shield 206 on the CPP TMR read sensor, and exhibit soft ferromagnetic properties needed for effective shielding.

Figure 17:
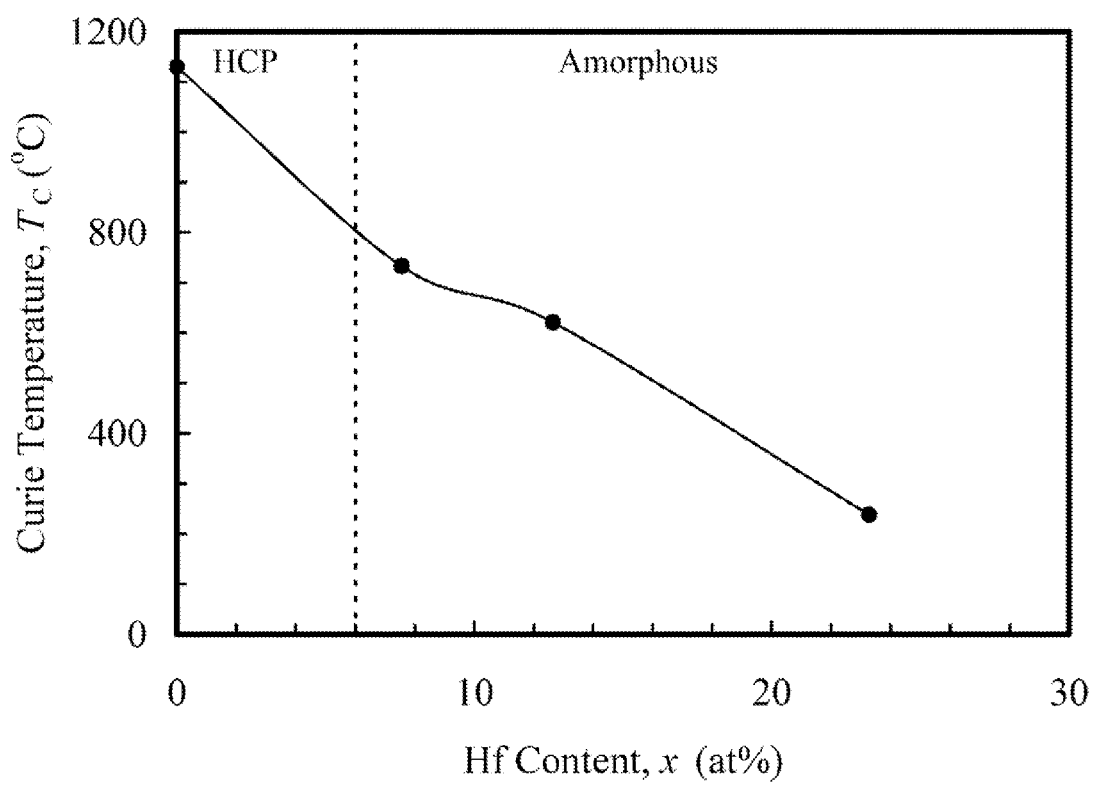
FIG. 17 is a chart showing the Curie temperature ($T_C$) versus the Hf content.

In addition, $M_S$ preferably remains high at a sensor operation temperature of about 120° C. This thermal property can be characterized by a Curie temperature ($T_c$), exceeding which $M_S$ becomes zero. FIG. 17 shows $T_C$ versus the Hf content for Ta(2)/Ru(2)/Co—Hf(20)/Ru(2)/Ta(2)/Ru(4) films after annealing for 5 hours at 280° C. $T_C$ decreases nearly monotonically from 1,130 to 238° C. as the Hf content increases from 0 to 23.8 at %. Although the Co—Hf film with this wide Hf content range exhibits an acceptable thermal property, it is still preferably to select a Co—Hf film with a lower Hf content for attaining a higher $T_C$ and thus ensuring a higher thermal property.

Figure 18:
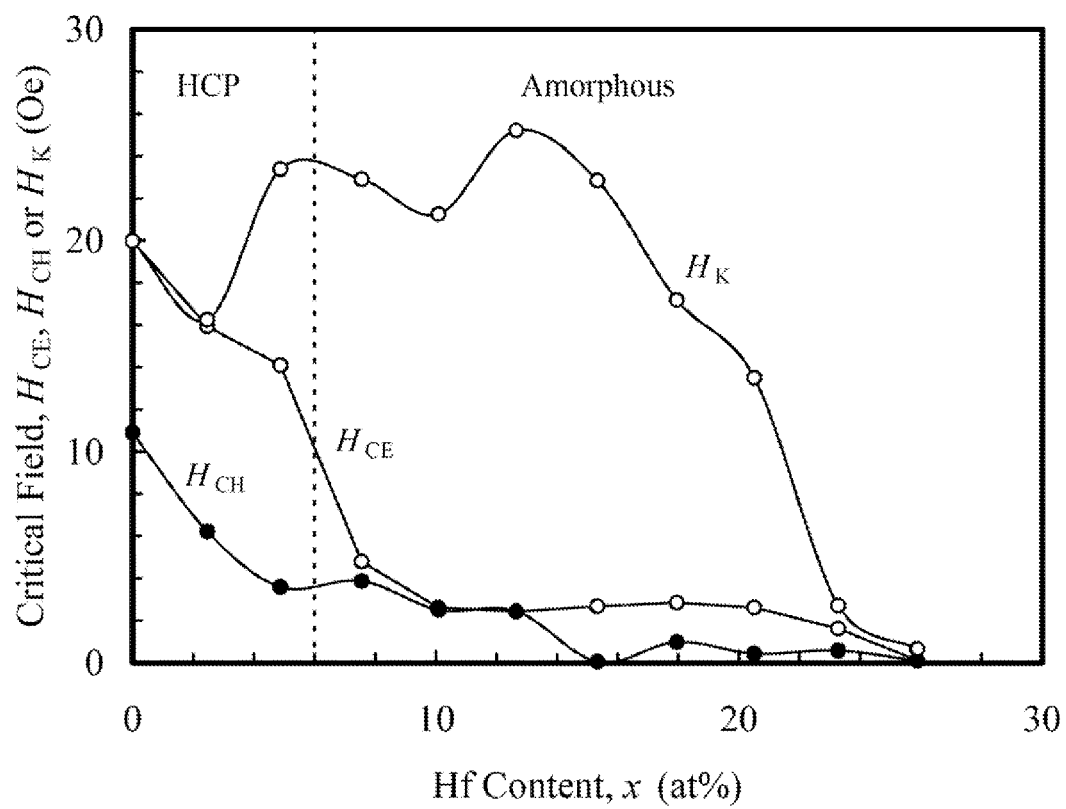
FIG. 18 is a chart showing $H_{CE}$, $H_{CH}$ and $H_K$ versus the Hf content for the Ta(2)/Ru(2)/Co—Hf(4)/Ru(2)/Ta(2)/Ru(4) films after annealing for 5 hours at 280° C.

FIG. 18 shows $H_{CE}$, $H_{CH}$ and $H_K$ versus the Hf content for the Ta(2)/Ru(2)/Co—Hf(4)/Ru(2)/Ta(2)/Ru(4) films after annealing for 5 hours at 280° C. The Co—Hf film with a Hf content ranging from 0 to 6 at % exhibits an HCP phase, $H_{CE}$ higher than 10 Oe, $H_{CH}$ higher than 3 Oe, and $H_K$ of around 20 Oe. The Co—Hf film with a Hf content ranging from 6 to 30 at % exhibits an amorphous phase, $H_{CE}$ lower than 10 Oe, $H_{CH}$ lower than 3 Oe, and $H_K$ lower than 26 Oe.

Figure 19:
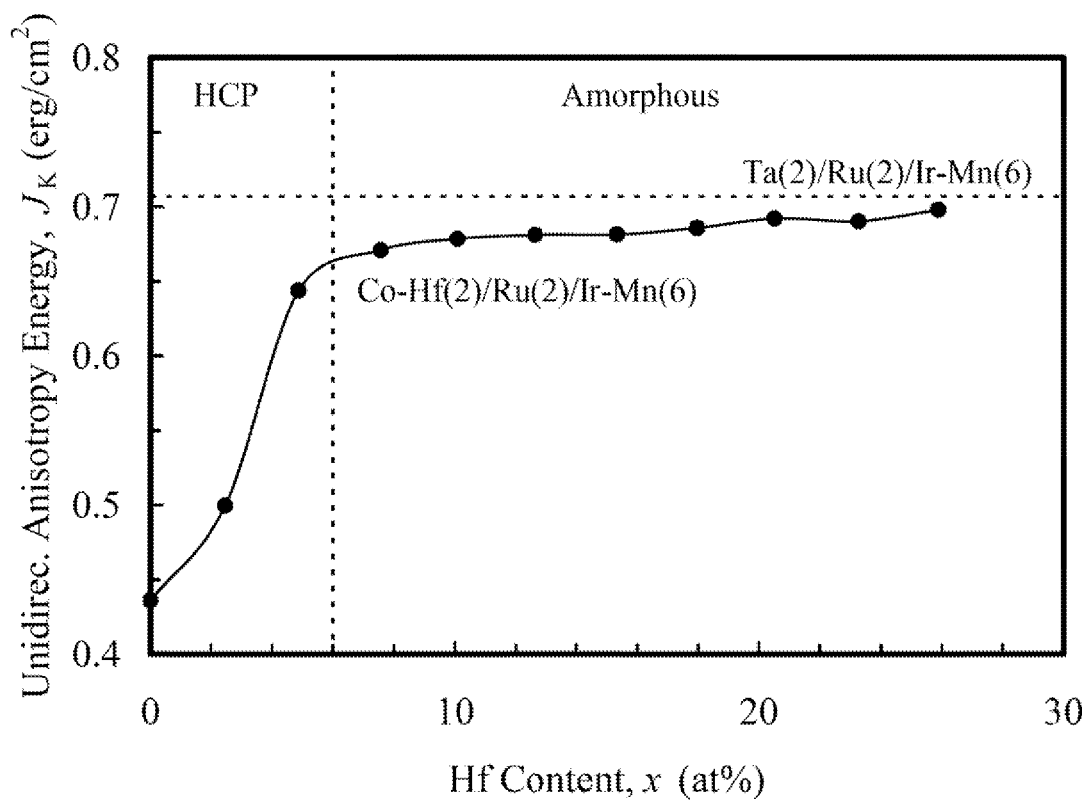
FIG. 19 is a chart showing $J_K$ versus the Hf content for Co—Hf(2)/Ru(2)/Ir—Mn(6)/Co—Fe(3.6)/Ru(2)/Ta(2)/Ru (4) films after annealing for 5 hours at 280° C.

FIG. 19 shows $J_K$ versus the Hf content for Co—Hf(2)/Ru (2)/Ir—Mn(6)/Co—Fe(3.6)/Ru(2)/Ta(2)/Ru(4) films after annealing for 5 hours at 280° C. $J_K$ sharply increases from 0.436 to 0.644 erg/cm$^2$ as the Hf content increases from 0 to 4.9 at %, and then slightly increases to 0.698 erg/cm$^2$ as the Hf content further increases to 25.9 at %.

Figure 20:
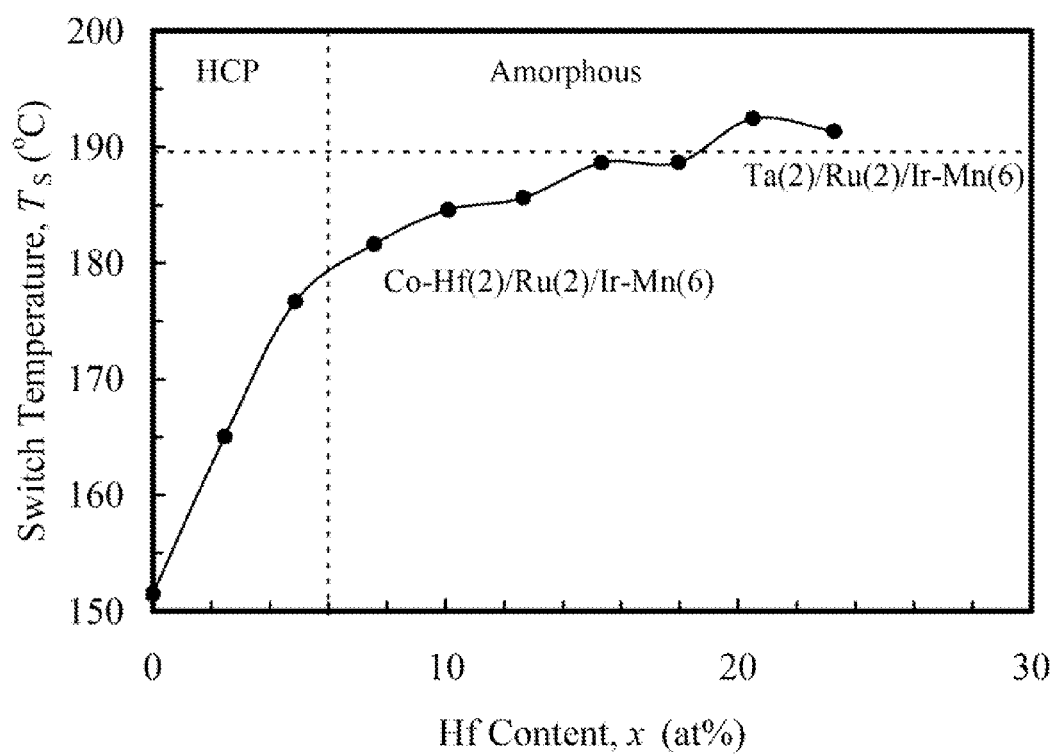
FIG. 20 is a chart showing $T_S$ versus the Hf content for Co—Hf(2)/Ru(2)/Ir—Mn(6)/Co—Fe(3.6)/Ru(2)/Ta(2)/Ru (4) films after annealing for 5 hours at 280° C.

FIG. 20 shows $T_S$ versus the Hf content for Co—Hf(2)/Ru (2)/Ir—Mn(6)/Co—Fe(3.6)/Ru(2)/Ta(2)/Ru(4) films after annealing for 5 hours at 280° C. $T_S$ sharply increases from 165.1 to 191.4° C. as the Hf content increases from 2.5 to 23.3 at %.

In summary, FIGS. 14-20 ensure the use of the 76.7Co-23.3Hf buffer layer 716 as a lower auxiliary shield in accordance with the preferred embodiment of the invention, due to its amorphous phase, low $H_{CE}$, nearly zero $H_{CH}$, low $H_K$, high $J_K$ and high $T_S$. Its Hf content may substantially decrease to 7.6 at %, in order to substantially increase $M_S$ from 407.8 emu/cm$^3$ to 1,111.3 emu/cm$^3$ and thus enhance its permeability, while still maintaining the amorphous phase and acceptable $H_{CE}$, $H_{CH}$, $H_K$, $J_K$ and $T_S$. Its Hf content may further decrease to 2.5 at %, in order to further increase $M_S$ to 1,291.3 emu/cm$^3$ and thus further enhance its permeability. However, the Co—Hf buffer layer 716 starts to show an HCP phase, and non-acceptable $H_{CE}$, $H_{CH}$, $J_K$ and $T_S$. Since the HCP phase may also act as an auxiliary seed layer in facilitating the Pt and Ru seed layers 716, 718 to exhibit high $J_K$, it is thus proposed to use dual buffer layers, one being preferably formed of a ferromagnetic, amorphous Co—Hf film with a Hf content ranging from 6 to 24 at % and a thickness ranging from 0.4 to 2 nm, and the other being preferably formed of a ferromagnetic, polycrystalline Co—Hf film with a I-If content ranging from 2 to 6 at % and a thickness ranging from 0.4 to 4 nm. The use of the dual buffer layers 1316, 1318 may solve several concerns caused by a simple replacement of the 76.7Co-23.3Hf buffer layer 716 with the 97.5Co-2.5Hf buffer layer, as described below.

Figure 21:
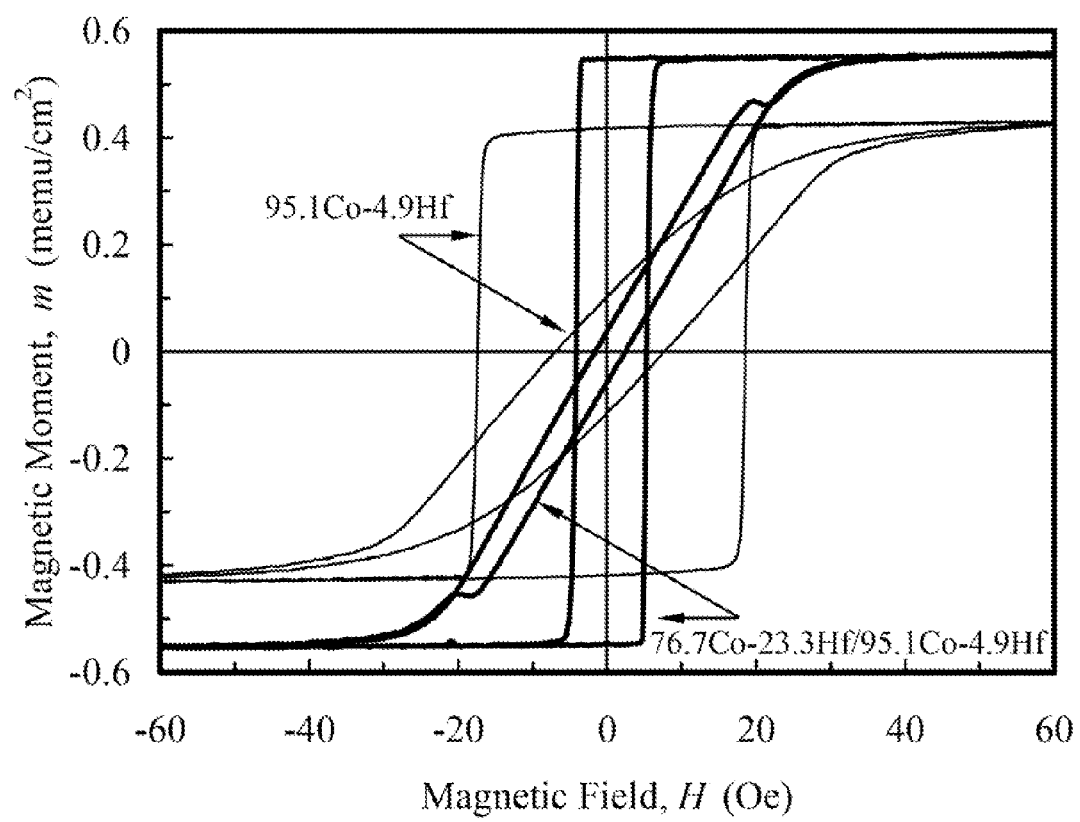
FIG. 21 is a chart showing easy- and hard-axis magnetic responses of 95.1Co-4.9Hf(4)/Ru(2)/Ta(2)/Ru(4) and 76.7Co-23.3Hf(2)/95.1Co-4.9Hf(4)/Ru(2)/Ta(2)/Ru(4) films after annealing for 5 hours at 280° C.

FIG. 21 shows easy- and hard-axis magnetic responses of 95.1Co-4.9Hf(4)/Ru(2)/Ta(2)/Ru(4) and 76.7Co-23.3Hf(2)/ 95.1Co-4.9Hf(4)/Ru(2)/Ta(2)/Ru(4) films after annealing for 5 hours at 280° C. The 76.7Co-23.3Hf lower buffer layer 1316 facilitates the 95.1Co-4.9Hf upper buffer layer 1318 to decrease $H_{CE}$ from 18.0 to 4.7 Oe, $H_{CH}$ from 7.7 to 1.5 Oe, and $H_K$ from 35.3 to 23.3 Oe. The use of the dual buffer layers 1316, 1318 in accordance with the alternative embodiment of the invention thus leads to soft ferromagnetic properties.

Figure 22:
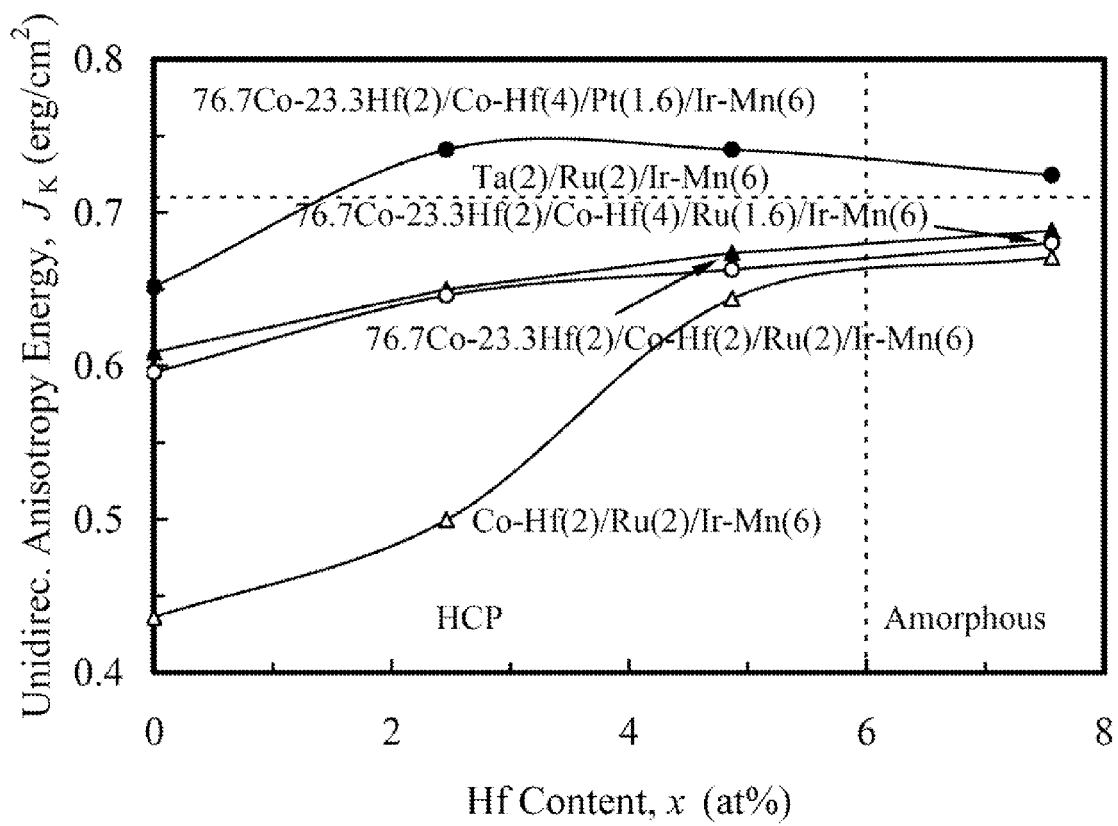
FIG. 22 is a chart showing $J_K$ versus the Hf content of the upper Co—Hf buffer layer for Co—Hf(2)/Ru(2)/Ir—Mn(6)/Co—Fe(3.6), 76.7Co-23.3Hf(2)/Co—Hf(2)/Ru(2)/Ir—Mn(6)/Co—Fe(3.6), 76.7Co-23.3Hf(2)/Co—Hf(4)/Ru(1.6)/Ir—Mn(6)/Co—Fe(3.6) and 76.7Co-23.3Hf(2)/Co—Hf(4)/Pt(1.6)/Ir—Mn(6)/Co—Fe(3.6) films with Ru(2)/Ta(2)/Ru (4) cap layers after annealing for 5 hours at 280° C.

FIG. 22 shows $J_K$ versus the Hf content of the Co—Hf upper buffer layer 1318 for Co—Hf(2)/Ru(2)/Ir—Mn(6)/ Co—Fe(3.6), 76.7Co-23.3Hf(2)/Co—Hf(2)/Ru(2)/Ir—Mn (6)/Co—Fe(3.6), 76.7Co-23.3Hf(2)/Co—Hf(4)/Ru(1.6)/ Ir—Mn(6)/Co—Fe(3.6) and 76.7Co-23.3Hf(2)/Co—Hf(4)/ Pt(1.6)/Ir—Mn(6)/Co—Fe(3.6) films with Ru(2)/Ta(2)/Ru (4) cap layers after annealing for 5 hours at 280° C. The 76.7Co-23.3Hf lower buffer layer 1316 facilitates the 97.5Co-2.5Hf upper buffer layer 1318 to substantially increase $J_K$ from 0.500 to 0.650 erg/cm$^2$. A thicker 97.5Co-2.5Hf upper buffer layer 1318 but a thinner Ru seed layer can also lead to such a high $J_K$. In addition, a replacement of a 1.6 nm thick Ru seed layer with a 1.6 nm thick Pt seed layer further causes an increase in $J_K$ from 0.646 to 0.741 erg/cm$^2$. Therefore, the combined uses of the 76.7Co-23.3Hf lower buffer layer 1316, the 97.5Co-2.5Hf upper buffer layer 1318, and the Pt lower seed layer 716 in accordance with the alternative embodiment of the invention lead to a $J_K$ higher than the control (0.707 erg/cm$^2$) with the Ta buffer and Ru seed layers.

Figure 23:
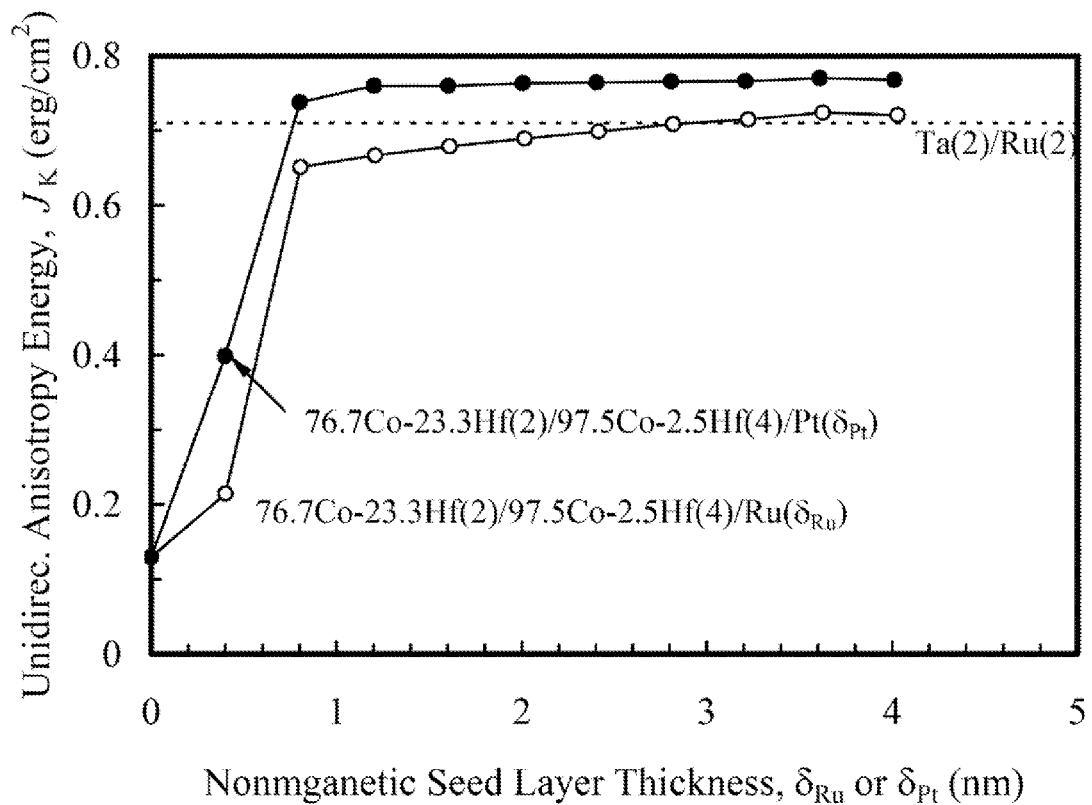
FIG. 23 is a chart showing $J_K$ versus the nonmagnetic seed layer ($\delta_{NM}$) for 76.7Co-23.3Hf(2)/97.5Co-2.5Hf(4)/Ru ($\delta_{NM}$)/Ir—Mn(6)/Co—Fe(3.6) and 76.7Co-23.3Hf (2)/97.5Co-2.5Hf(4)/Pt($\delta_{NM}$)/Ir—Mn(6)/Co—Fe(3.6) films with Ru(2)/Ta(2)/Ru(4) cap layers after annealing for 5 hours at 280° C.

FIG. 23 shows $J_K$ versus the nonmagnetic seed layer ($\delta_{NM}$) for 76.7Co-23.3Hf (2)/97.5Co-2.5Hf(4)/Ru($\delta_{NM}$)/Ir—Mn (6)/Co—Fe(3.6) and 76.7Co-23.3Hf (2)/97.5Co-2.5Hf(4)/Pt ($\delta_{NM}$)/Ir—Mn(6)/Co—Fe(3.6) films with Ru(2)/Ta(2)/Ru(4) cap layers after annealing for 5 hours at 280° C. The Ru and Pt seed layers can be as thin as 0.8 nm to reach $J_K$ of as high as 0.651 and 0.738 erg/cm$^2$, respectively. It is thus suggested in the alternative embodiment of the invention to decrease the Pt seed layer thickness from 2 to 0.8 nm and increase the Ir—Mn pinning layer thickness from 6 to 7.2 nm, in order to substantially increase $T_S$, as described below.

Figure 24:
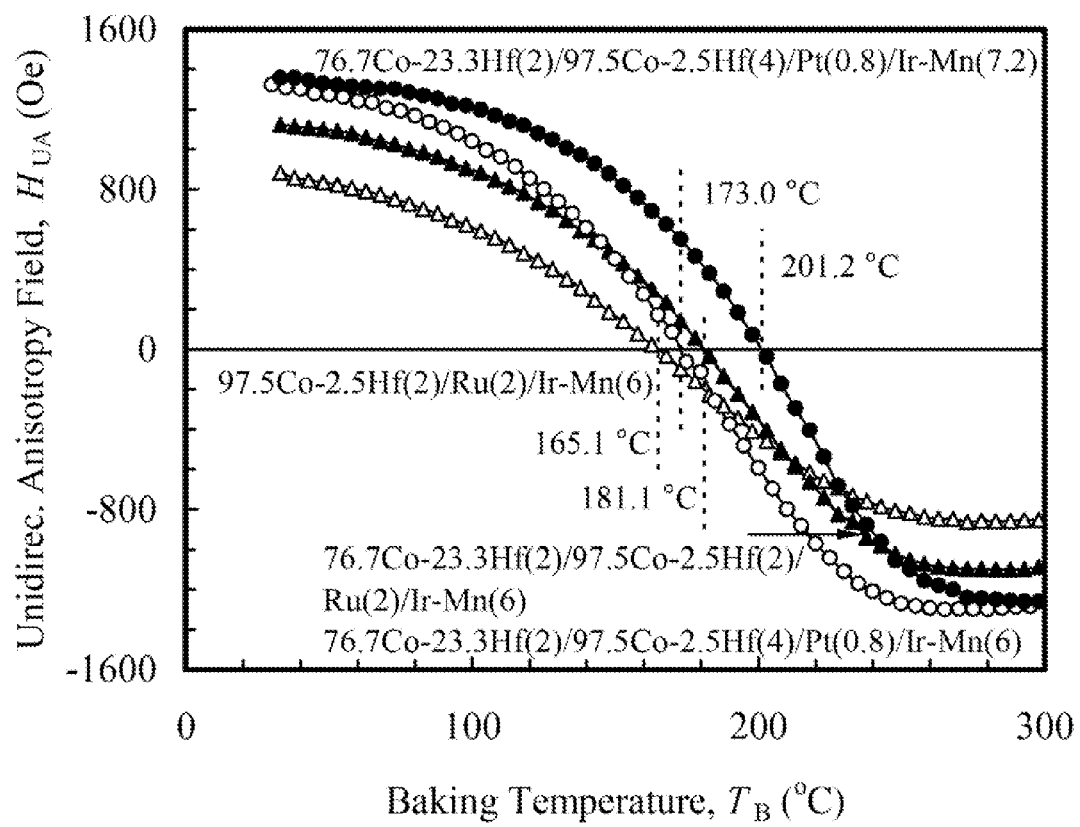
FIG. 24 is a chart showing $H_{UA}$ determined from the easy-axis resistance response versus $T_B$ for 97.5Co-2.5Hf(2)/Ru (2)/Ir—Mn(6)/Co—Fe(3.6), 76.7Co-23.3Hf(2)/97.5Co-2.5Hf(2)/Ru(2)/Ir—Mn(6)/Co—Fe(3.6), 76.7Co-23.3Hf(2)/97.5Co-2.5Hf(4)/Pt(0.8)/Ir—Mn(6)/Co—Fe(3.6), and 76.7Co-23.3Hf(2)/97.5Co-2.5Hf(4)/Pt(0.8)/Ir—Mn(7.2)/Co—Fe(3.6) films with Ru(2)/Ta(2)/Ru(4) cap layers before and after baking at $T_B$.

FIG. 24 shows $H_{UA}$ determined from the easy-axis resistance response versus $T_B$ for 97.5Co-2.5Hf(2)/Ru(2)/Ir—Mn (6)/Co—Fe(3.6), 76.7Co-23.3Hf(2)/97.5Co-2.5Hf(2)/Ru (2)/Ir—Mn(6)/Co—Fe(3.6), 76.7Co-23.3Hf(2)/97.5Co-2.5Hf(4)/Pt(0.8)/Ir—Mn(6)/Co—Fe(3.6), and 76.7Co-23.3Hf(2)/97.5Co-2.5Hf(4)/Pt(0.8)/Ir—Mn(7.2)/Co—Fe (3.6) films with Ru(2)/Ta(2)/Ru(4) cap layers before and after baking at $T_B$. The 76.7Co-23.3Hf lower buffer layer 1316 facilitates the 95.1Co-4.9Hf upper buffer layer's 1318 substantial increase in $T_S$ from 165.1 to 181.1° C. On the other hand, although the Pt seed layer 716 deposited on the dual buffer layers in accordance with the alternative embodiment of the invention can be as thin as 0.8 nm to attain a $J_K$ of as high as 0.738 erg/cm$^2$, $T_S$ is as low as 173.0° C. By increasing the thickness of the Ir—Mn pinning layer 220 from 6 to 7.2 nm, $T_S$ substantially increases from 173.0 to 201.2° C. It is thus suggested, in addition to the uses of the dual buffer layers 1316, 1318 and the dual seed layer 716, 718 in accordance with the preferred embodiment of the invention, to increase the thickness of the Ir—Mn pinning layer 220 for robust thermal properties.

In summary, FIGS. 21-24 confirm that the use of the dual buffer layers 1316, 1318 in accordance with the alternative embodiment of the invention solves several concerns caused by a simple replacement of the 76.7Co-23.3Hf buffer layer 716 with the 97.5Co-2.5Hf buffer layer. The lower buffer layer 1316 can be as thin as possible, as long as it forms a continuous film and eliminates microstructural effects of the lower shield 206 on the TMR sensor 1301 with its amorphous phase. The upper buffer layer 1318 can be as thick as possible in order to act as an effective lower auxiliary shield with its high $M_S$, and as an effective ferromagnetic seed layer with its polycrystalline phase. With the upper buffer layer 1318 acting as the ferromagnetic seed layer, the nonmagnetic lower and upper seed layers 716, 718 can be as thin as possible, as long as they still act as decoupling layers between the upper buffer layer 1318 and the TMR sensor 1301. Since the nonmagnetic lower and upper seed layers 716, 718 are portions of the read gap, minimizing their thicknesses may lead to a thinner read gap. However, a thicker upper buffer layer 1318 may induce grain boundary grooving and thus create a rough interface on which the CPP TMR sensor 1301 will grow.

The uses of the dual buffer layers 1316, 1318 and the dual seed layers 716, 718 must not deteriorate magnetic and TMR properties of the CPP TMR read sensor 1301. Table 2 summarizes $H_{CE}$, $H_F$, $R_JA_J$ and $\Delta R_T/R_J$ determined from easy-axis magnetic and resistance responses of the CPP TMR read sensors with various buffer and seed layers after annealing for 5 hours at 280° C. in accordance with the prior art, preferred and alternative embodiments of the invention. With the Ta(2)/Ru(2), 76.7Co-23.3Hf(2)/Ru(2), 76.7Co-23.3Hf(2)/Pt(2), and 76.7Co-23.3Hf(2)/97.5Co-2.5Hf(4)/Pt(0.4)/Ru(1.6) films underneath 6 nm thick Ir—Mn pinning layers 220 and with identical $MgO_X$ barrier layers 210, CPP TMR read sensors exhibit $H_{CE}$ values of 3.5, 2.3, 2.4 and 2.6 Oe, respectively, $H_F$ values of 127.0, 125.5, 120.9 and 131.8 Oe, respectively. $R_JA_J$ values of 0.66, 0.65, 0.68 and 0.64Ω-μm², respectively, and $\Delta R_T/R_J$ values of 65.9, 63.5, 71.1 and 66.4%, respectively. The incorporation of the dual buffer layers 1316, 1318 and the dual seed layers 716, 718 into the CPP TMR read sensor 1301 thus does not substantially vary its magnetic and TMR properties. It should be noted though that the incorporation causes a slight $H_F$ increase, indicating a rougher lower interface of the $MgO_X$ barrier layer 210, and it can be expected that an even thicker upper buffer layer 1318 may further roughen the lower interface and increase $H_F$.

TABLE 2

| Buffer Layers (nm) | Seed Layers (nm) | $H_{CE}$ (Oe) | $H_F$ (Oe) | $R_JA_J$ (Ω-μm²) | $\Delta R_T/R_J$ (%) |
|---|---|---|---|---|---|
| Ta(2) | Ru(2) | 3.5 | 127.0 | 0.66 | 65.9 |
| 76.7Co—23.3Hf(2) | Ru(2) | 2.3 | 125.5 | 0.65 | 63.5 |
| 76.7Co—23.3Hf(2) | Pt(2) | 2.4 | 120.9 | 0.68 | 71.1 |
| 76.7Co—23.3Hf(2)/ 97.5Co—2.5Hf(4) | Pt(0.4)/ Ru(1.6) | 2.6 | 131.8 | 0.64 | 66.4 |

The surface roughness can be reduced by depositing the dual buffer layer 1316, 1318 and the dual seed layers 716, 718 with a high-energy DC-magnetron sputtering mode, while the rough surface can be smoothened by applying a plasma treatment to the upper buffer layer 1318. In order to minimize effects of the rough surface on the CPP TMR sensor 1301, the pinning layer 220, the keeper layer structure 222, the antiparral-coupling layer 226 and the reference layer structure 224 can also be deposited with the high-energy DC-magnetron sputtering mode. In contrast to a conventional DC-magnetron sputtering mode conducted at ~0.15 mTorr in argon (Ar) gases, the high-energy DC-magnetron sputtering mode is conducted at ≤0.1 mtorr in xenon (Xe) gases. Since Xe ions of 0.131 nm in radius are much larger than Ar ions of 0.098 nm in radius and travel at a longer mean free path between successive collisions at a lower gas pressure, they may cause heavier bombardments on a surface formed by sputtered atoms and thus enhance mobility of the sputtered atoms, thereby producing a smoother surface. The high-energy DC-magnetron sputtering mode is basically similar to a high-energy ion-beam sputtering mode, except that it has no directionality so that interface mixing will be milder and moment losses will be less.

The use of the high-energy DC-magnetron sputtering mode must not deteriorate desired magnetic and TMR properties of the CPP TMR read sensor 1301. Since the thickest Ir—Mn pinning layer 220 dominates the surface roughness and its composition must be very well controlled in a very narrow range for a designed $J_K$, its deposition with conventional and high-energy DC-magnetron sputtering modes are evaluated below.

Figure 25:
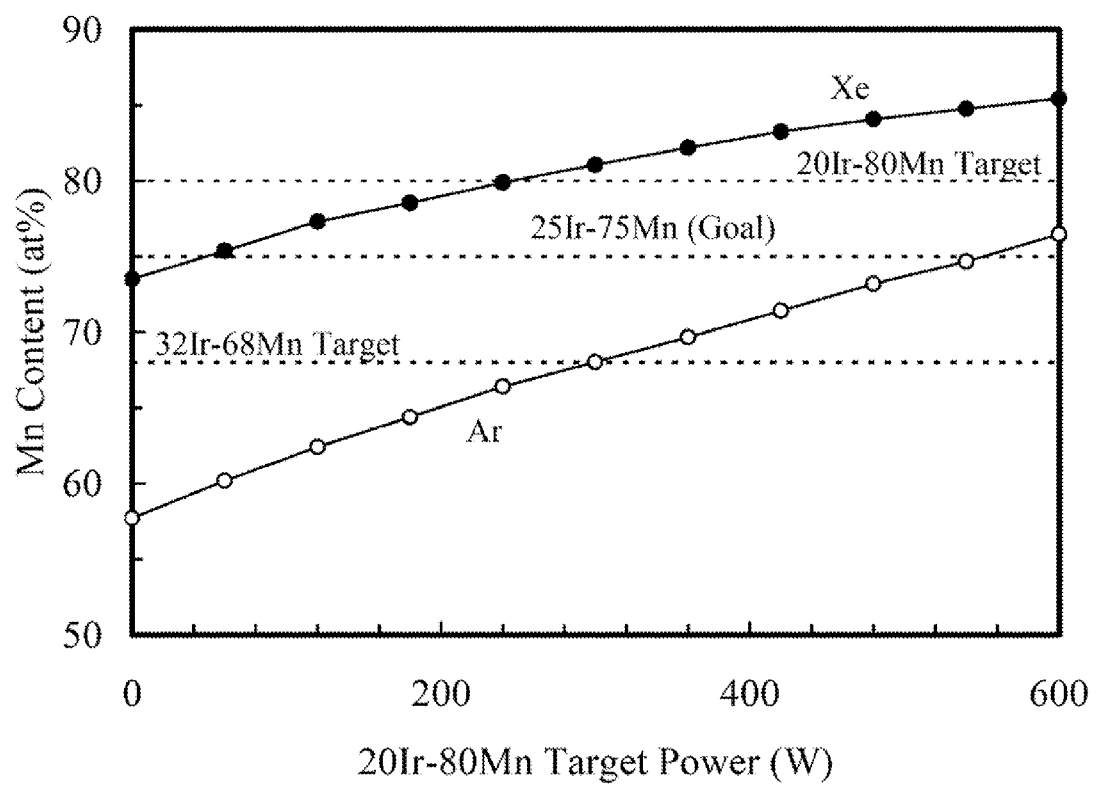
FIG. 25 is a chart showing the Mn content versus the 20Ir-80Mn target power.

The Ir—Mn pinning layer 220 is deposited by co-sputtering 36Ir-68Mn and 20Ir-80Mn targets with a total power of 600 W at either 0.15 mtorr in Ar gases or 0.08 mtorr in Xe gases. FIG. 25 shows the Mn content versus the 20Ir-80Mn target power. Sputtering the 36Ir-68Mn and 20Ir-80Mn targets independently in Ar gases produces Ir—Mn films with Mn contents of 57.7 and 76.5 at %, respectively. Sputtering the 36Ir-68Mn and 20Ir-80Mn targets independently in Xe gases produces Ir—Mn films with Mn contents of 73.5 and 85.4 at %, respectively. Therefore, the Mn content is lower than the Ir—Mn target when sputtering in Ar gases, but is higher than the Ir—Mn target when sputtering in Xe gases. In order to attain a desired Mn content of 75 at %, co-sputtering from the 36Ir-68Mn at 60 W and the 20Ir-80Mn target at 540 W in Ar gases is needed, or co-sputtering from the 36Ir-68Mn at 540 W and the 20Ir-80Mn target at 60 W in Xe gases is needed.

Figure 26:
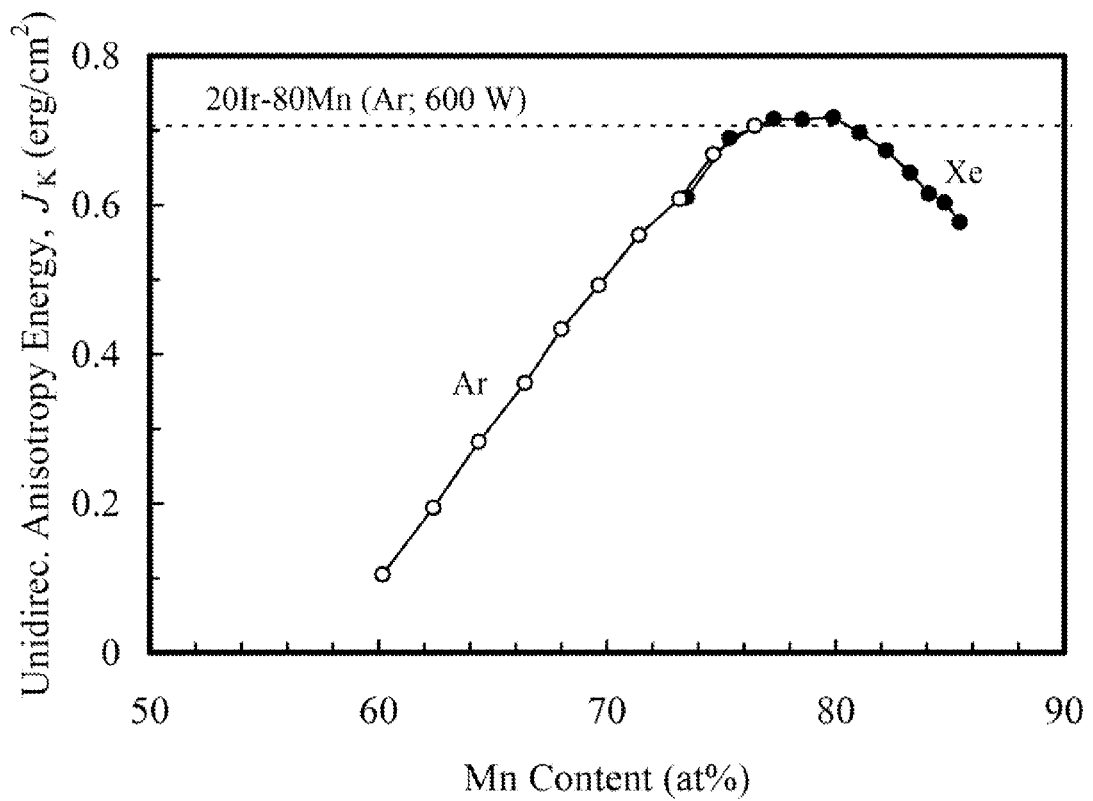
FIG. 26 is a chart showing $J_K$ versus the Mn content for Ta(2)/Ru(2)/Ir—Mn(6)/Co—Fe(3.6)/Ru(2)/Ta(2)/Ru(4) films after annealing for 5 hours at 280° C.

FIG. 26 shows $J_K$ versus the Mn content for Ta(2)/Ru(2)/Ir—Mn(6)/Co—Fe(3.6)/Ru(2)/Ta(2)/Ru(4) films after annealing for 5 hours at 280° C. $J_K$ is comparable to the designed value (0.707 erg/cm²) when the Mn content ranges from 75.4 to 81.0 at %. Therefore, the high-energy DC-magnetron sputtering mode does not lead to a higher $J_K$.

While various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A read sensor comprising:
   a buffer layer formed of a Co—Hf film with a Hf content ranging from 6 to 30 at % and a thickness ranging from 0.6 to 4 nm;
   dual seed layers on the buffer layer;
   a pinning layer on the seed layer structure;
   a keeper layer structure on the pinning layer;
   an antiparallel coupling layer on the keeper layer structure;
   a reference layer structure on the antiparallel coupling layer;
   a nonmagnetic layer on the reference layer structure;
   a sense layer structure on the nonmagnetic layer;
   dual cap layers on the sense layer structure; and
   an upper auxiliary shield on the dual cap layers.

2. The read sensor as in claim 1, wherein the dual seed layers comprise a lower seed layer formed of a nonmagnetic Pt film with a thickness ranging from 0.4 to 2 nm, and an upper seed layer formed of a nonmagnetic Ru film with a thickness ranging from 0.4 to 2 nm.

3. The read sensor as in claim 1, wherein the pinning layer is formed of an Ir—Mn film with a Mn content ranging from 76 to 84 at % and a thickness ranging from 4 to 8 nm.

4. The read sensor as in claim 1, wherein the dual cap layers comprise a lower cap layer preferably formed of a nonmagnetic Pt film with a thickness ranging from 0.4 to 2 nm, and an upper cap layer preferably formed of a nonmagnetic Ru film with a thickness ranging from 0.4 to 2 nm.

5. The read sensor as in claim 1 wherein the upper auxiliary shield is formed of a Ni—Fe film with an Fe content ranging from 0 to 40 atomic percent and a thickness ranging from 2 to 6 nm.

6. The read sensor as in claim 1 wherein the upper auxiliary shield is formed of a Ni—Fe film with an Fe content ranging from 0 to 40 and a thickness ranging from 2 to 6 nm.

7. A read head, comprising:
a buffer layer;
  dual seed layers on the buffer layer;
  a pinning layer on the seed layer structure;
  a keeper layer structure on the pinning layer;
  an antiparallel coupling layer on the keeper layer structure;
  a reference layer structure on the antiparallel coupling layer;
  a nonmagnetic layer on the reference layer structure;
  a sense layer structure on the nonmagnetic layer;
  dual cap layers on the sense layer structure; and
an upper auxiliary shield on the dual cap layers
  a lower shield contacting and magnetically coupling with the buffer layer; and
  an upper shield contacting and magnetically coupling with the upper auxiliary shield;
  wherein the dual buffer layer structure comprises a lower buffer layer formed of a Co—Hf film with a Hf content ranging from 6 to 30 at % and a thickness ranging from 0.6 to 4 nm, and an upper buffer layer formed of a Co—Hf film with a Hf content ranging from 2 to 6 at % and a thickness ranging from 0.6 to 4 nm.

8. The read head as in claim 7 further comprising an insulation layer in each of two side regions adjacent to the read sensor, and a longitudinal bias stack on the insulation layer in each of the two side regions.

9. The read head as in claim 8, wherein the buffer layer extends into the two side regions and acts as a lower auxiliary shield.

10. The read head as in claim 7, wherein a distance between an upper interface of the buffer layer and a lower interface of the upper auxiliary shield defines a read gap.

11. The read sensor as in claim 7, wherein the dual seed layer structure comprise a lower seed layer formed of a nonmagnetic Pt film with a thickness ranging from 0.4 to 2 nm, and an upper seed layer formed of a nonmagnetic Ru film with a thickness ranging from 0.4 to 2 nm.

12. The read sensor as in claim 7, wherein the pinning layer is formed of an Ir—Mn film with a Mn content ranging from 76 to 84 at % and a thickness ranging from 4 to 8 nm.

13. The read sensor as in claim 7, wherein the dual cap layer structure comprises a lower cap layer formed of a nonmagnetic Pt film with a thickness ranging from 0.4 to 2 nm, and an upper cap layer formed of a nonmagnetic Ru film with a thickness ranging from 0.4 to 2 nm.

* * * * *

UNITED STATES PATENT AND TRADEMARK OFFICE
CERTIFICATE OF CORRECTION

PATENT NO. : 8,675,317 B2
APPLICATION NO. : 12/976932
DATED : March 18, 2014
INVENTOR(S) : Tsann Lin Page 1 of 1

It is certified that error appears in the above-identified patent and that said Letters Patent is hereby corrected as shown below:

In the Specification:

Column 5, line 49 replace "(MgO), or Me" with --(MgO), or Mg--.

Signed and Sealed this
Seventh Day of July, 2015

Michelle K. Lee
*Director of the United States Patent and Trademark Office*